United States Patent
Miyatake et al.

(10) Patent No.: US 12,219,724 B2
(45) Date of Patent: *Feb. 4, 2025

(54) ELECTRONIC DEVICE AND DEVICE HOLDING SYSTEM

(71) Applicant: NINTENDO CO., LTD., Kyoto (JP)

(72) Inventors: Junichiro Miyatake, Kyoto (JP); Yuya Okazaki, Kyoto (JP); Takafumi Nishida, Kyoto (JP)

(73) Assignee: Nintendo Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/527,685

(22) Filed: Dec. 4, 2023

(65) Prior Publication Data

US 2024/0114639 A1 Apr. 4, 2024

Related U.S. Application Data

(63) Continuation of application No. 17/582,122, filed on Jan. 24, 2022, now Pat. No. 11,871,530.

(30) Foreign Application Priority Data

May 28, 2021 (JP) .................................. 2021-090602

(51) Int. Cl.
H05K 5/02 (2006.01)
H05K 5/00 (2006.01)

(52) U.S. Cl.
CPC ......... H05K 5/0234 (2013.01); H05K 5/0017 (2013.01)

(58) Field of Classification Search
None
See application file for complete search history.

(56) References Cited

U.S. PATENT DOCUMENTS 8,274,784 B2 9/2012 Franz
8,520,371 B2 * 8/2013 Peng .................... F16M 13/005
248/920

(Continued)

FOREIGN PATENT DOCUMENTS

JP 2005-204005 7/2005
JP 2014-216776 11/2014

(Continued)

OTHER PUBLICATIONS

Extended European Search Report issued on Jul. 15, 2022 in corresponding European Application No. 22153110.6, 7 pages.

(Continued)

*Primary Examiner* — James Wu
*Assistant Examiner* — Christopher L Augustin
(74) *Attorney, Agent, or Firm* — Nixon & Vanderhye P.C.

(57) ABSTRACT

An electronic device includes: a housing; a display provided at a front side thereof; and a stand provided at a back side thereof. The housing has a transition wall between back and bottom walls, which extends further to the front as further downwardly separated from the back wall. The transition wall has a recessed part and a ventilation hole communicated with the recessed part. The stand is attached to the housing so that the stand can move between a closed state where the stand approaches the back wall and an open state where a bottom end part of the stand is separated away from the back wall so that the stand can support the housing at an angle from a placement surface. The stand is configured so that the bottom end part of the stand covers part of the recessed part when the stand is in the closed state.

18 Claims, 16 Drawing Sheets

(56) References Cited

U.S. PATENT DOCUMENTS

| | | |
|---|---|---|
| 10,061,348 B2 | 8/2018 | Shen |
| 10,268,240 B2 | 4/2019 | Shen |
| 2003/0004690 A1 | 1/2003 | Maeda |
| 2004/0261422 A1 | 12/2004 | McEuen |
| 2009/0321609 A1 | 12/2009 | Wang |
| 2012/0215284 A1* | 8/2012 | Berg ................ H05K 5/00 607/59 |
| 2014/0320752 A1 | 10/2014 | Kawasaki et al. |
| 2016/0088749 A1 | 3/2016 | Liu et al. |
| 2017/0010629 A1* | 1/2017 | Tsuchihashi ............ G06F 1/166 |
| 2017/0117729 A1 | 4/2017 | Hirose |
| 2017/0191608 A1 | 7/2017 | Li et al. |
| 2018/0217633 A1 | 8/2018 | Ku |
| 2020/0192429 A1 | 6/2020 | Wu |

FOREIGN PATENT DOCUMENTS

| | | |
|---|---|---|
| JP | 2015-088899 | 5/2015 |
| JP | 2019-061687 | 4/2019 |

OTHER PUBLICATIONS

Office Action dated Feb. 28, 2023 issued in Japanese Application No. 2021-090602 (2 pages).

\* cited by examiner

FIG. 7
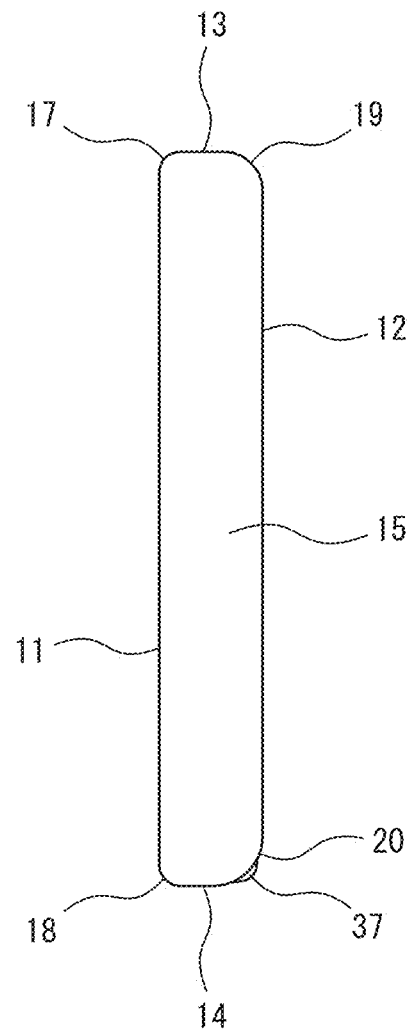
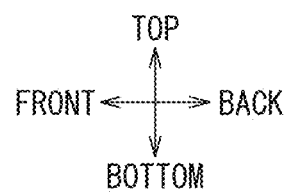

FIG. 8
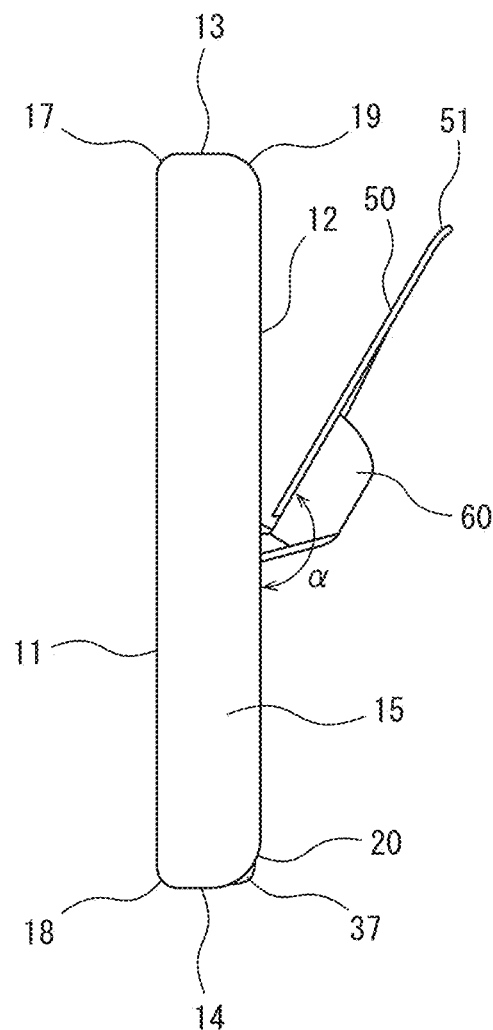
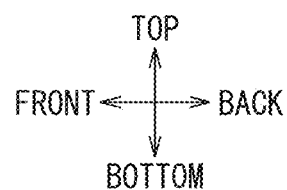

ELECTRONIC DEVICE AND DEVICE HOLDING SYSTEM

CROSS-REFERENCE TO RELATED APPLICATION

This application is a continuation of U.S. application Ser. No. 17/582,122, filed Jan. 24, 2022, now U.S. Pat. No. 11,871,530, which claims priority to Japanese Patent Application No. 2021-090602 filed on May 28, 2021, which is incorporated herein by reference in its entirety including the specifications, drawings and abstract.

FIELD

The present disclosure relates to an electronic device and a device holding system.

BACKGROUND

Known in the part has been an electronic device including a display having a display screen for displaying an image, a housing for holding the display, and a stand for supporting the housing (for example, JP 2014-216776 A). In particular, in the electronic device described in JP 2014-216776 A, one end of the stand is attached to the housing by hinges to be able to turn.

In the electronic device described in JP 2014-216776 A, there was room for improvement of the configuration of the stand.

SUMMARY

The gist of the present disclosure is as follows:
(1) An electronic device comprising: a housing; a display provided at a front surface side of the housing; and a stand provided at a back surface side of the housing, wherein,
the housing has a transition wall between a back wall and a bottom wall, which extends further to the front as further downwardly separated from the back wall, the transition wall having a recessed part and a ventilation hole communicated with the recessed part to connect an inside and outside of the housing,
the stand is attached to the housing so that the stand can move between a closed state where the stand approaches the back wall of the housing and an open state where a bottom end part of the stand is separated away from the back wall of the housing so that the stand can support the housing at an angle from a placement surface, and
the stand is configured so that the bottom end part of the stand covers part of the recessed part when the stand is in the closed state.
(2) The electronic device according to the above (1), wherein the stand has an inside surface facing the back wall of the housing and extending along the back wall when the stand is in the closed state, an outside surface facing a back direction of the housing when the stand is in the closed state, and a connecting surface formed between the inside surface and outside surface of the stand and connecting the inside surface and outside surface at the bottom, the connecting surface being formed so as to face a front direction of the housing when the stand is in the closed state.
(3) The electronic device according to the above (2), wherein the connecting surface extends at an acute angle with respect to the outside surface of the stand.
(4) The electronic device according to the above (2) or (3), wherein the transition wall has a recess defining wall, which define the recessed part, the recess defining wall has a lower side surface defining wall defining a side surface at the bottom side of the recessed part, and the connecting surface is formed so as to be substantially parallel to the lower side surface defining wall when the stand is in the closed state.
(5) The electronic device according to any one of the above (1) to (4), wherein the transition wall is provided with a projecting part sticking out from the transition wall to the outside at regions not covered by the stand when the stand is in the closed state.
(6) The electronic device according to any one of the above (1) to (5), wherein the bottom end part of the stand is curved so as to extend further to the front as further downwardly positioned, when the stand is in the closed state.
(7) The electronic device according to any one of the above (1) to (6), wherein the bottom end part of the stand is configured so as to cover an upper part of the recessed part in all regions of the recessed part in the lateral width direction of the housing, when the stand is in the closed state.
(8) The electronic device according to any one of the above (1) to (7), wherein
the recessed part extends in the lateral width direction of the housing, and
the bottom edge of the stand extends straight in the lateral width direction of the housing, in the regions of the bottom end part of the stand which cover the recessed part when the stand is in the closed state.
(9) The electronic device according to any one of the above (1) to (8), wherein
the transition wall has a recess defining wall, which defines the recessed part, the recess defining wall has pluralities of ribs extending in the top-bottom direction and/or the front-back direction and arranged aligned in the lateral width direction of the housing, and the ventilation hole is formed between some of the adjacent ribs, and the spaces between the remaining adjacent ribs are closed.
(10) The electronic device according to the above (9), wherein the ventilation hole is formed between the adjacent ribs positioned at the center side in the lateral width direction of the housing, the spaces between the adjacent ribs positioned at the outsides in the lateral width direction of the housing are closed, and a speaker hole is provided at the parts of the front wall of the housing positioned at the front of the closed parts.
(11) The electronic device according to any one of the above (1) to (10), wherein
the housing has a guide recessed part guided by a projecting part provided at a device holding apparatus for holding the electronic device, when the electronic device is inserted with its bottom surface facing down into the device holding apparatus,
the guide recessed part is provided at the back wall and the transition wall, is depressed down from the back surface of the housing toward the front, and extends more upward than the recessed part, and
the stand has a cutaway part so as not to cover the guide recessed part when the stand is in the closed state.

(12) The electronic device according to the above (11), wherein the length of the cutaway part in the lateral width direction of the housing is longer than the length of the guide recessed part in the lateral width direction of the housing.

(13) The electronic device according to the above (11) or (12), wherein the recessed part is provided at the both sides of the guide recessed part in the lateral width direction of the housing.

(14) The electronic device according to any one of the above (1) to (13), wherein the recessed part has length in the lateral width direction of the housing of greater than or equal to half of the housing.

(15) The electronic device according to any one of the above (1) to (14), wherein the stand has a length in the lateral width direction of the housing of greater than or equal to half of the housing.

(16) A device holding system having an electronic device according to any one of the above (11) to (13) and a device holding apparatus holding the electronic device, wherein, the device holding apparatus has a projecting part guiding a guide recessed part provided at the electronic device, when the electronic device is inserted with the bottom surface facing downward into the device holding apparatus.

BRIEF DESCRIPTION OF DRAWINGS

Embodiments of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a side view of the electronic device when the stand is in a closed state.

FIG. 8 is a side view of an electronic device when a stand is in a most open state.

DESCRIPTION OF EMBODIMENTS

Figure 1:
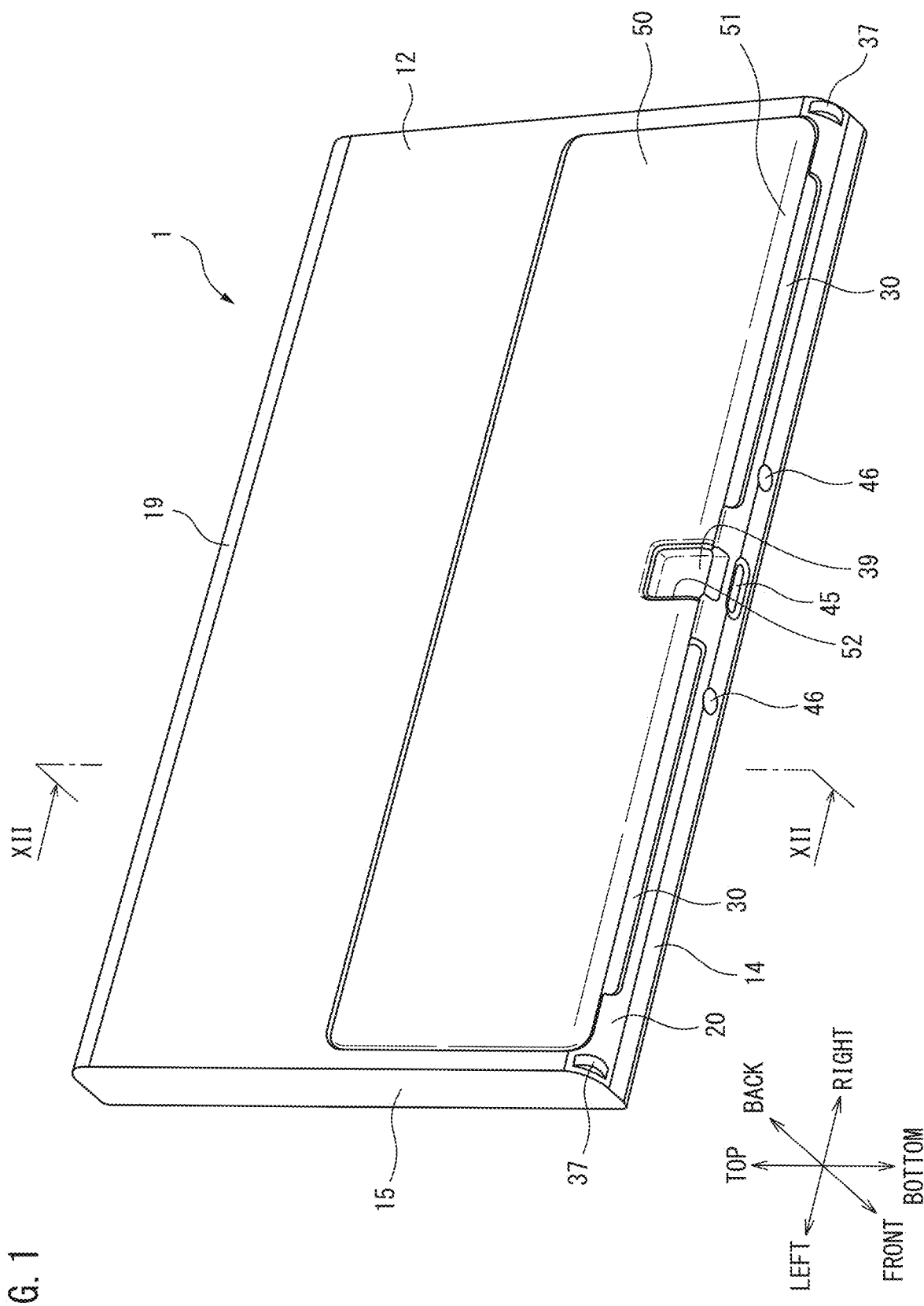
FIG. 1 is a perspective view of an electronic device seen from below and the back.

Below, referring to the drawings, embodiments will be explained in detail. Note that, in the following explanation, similar components will be assigned the same reference notations.

Overall Configuration of Electronic Device

Referring to FIGS. 1 to 8, the overall configuration of an electronic device 1 according to one embodiment will be explained. The electronic device 1 is a substantially cuboid-shaped device provided with a display, for example, is a portable game device, tablet, mobile monitor, or the like. In particular, in the present embodiment, the electronic device 1 is a portable device used in a state placed on a placement surface such as the floor surface, a table top, or the like.

Figure 2:
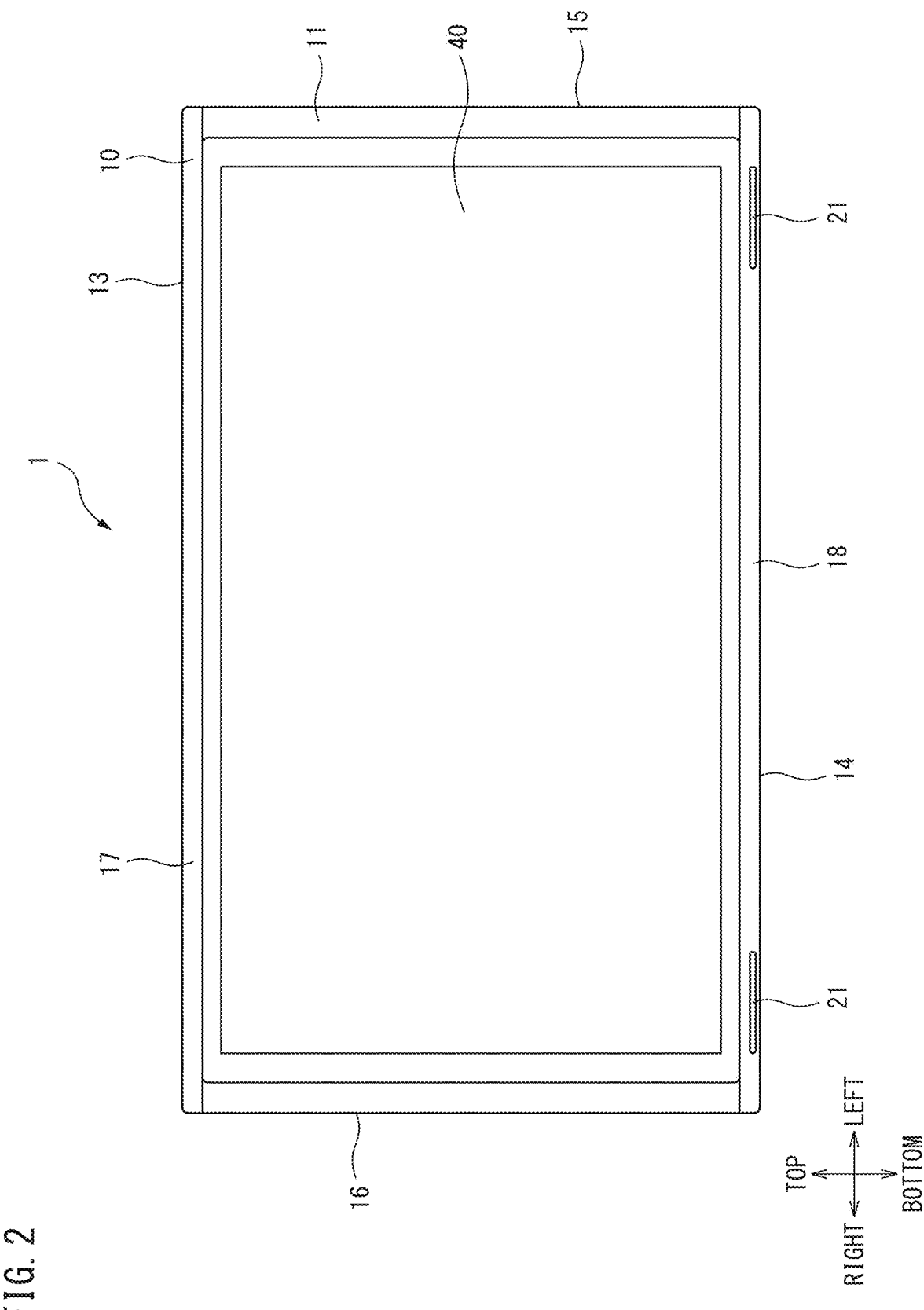
FIG. 2 is a front view of the electronic device.
Figure 3:
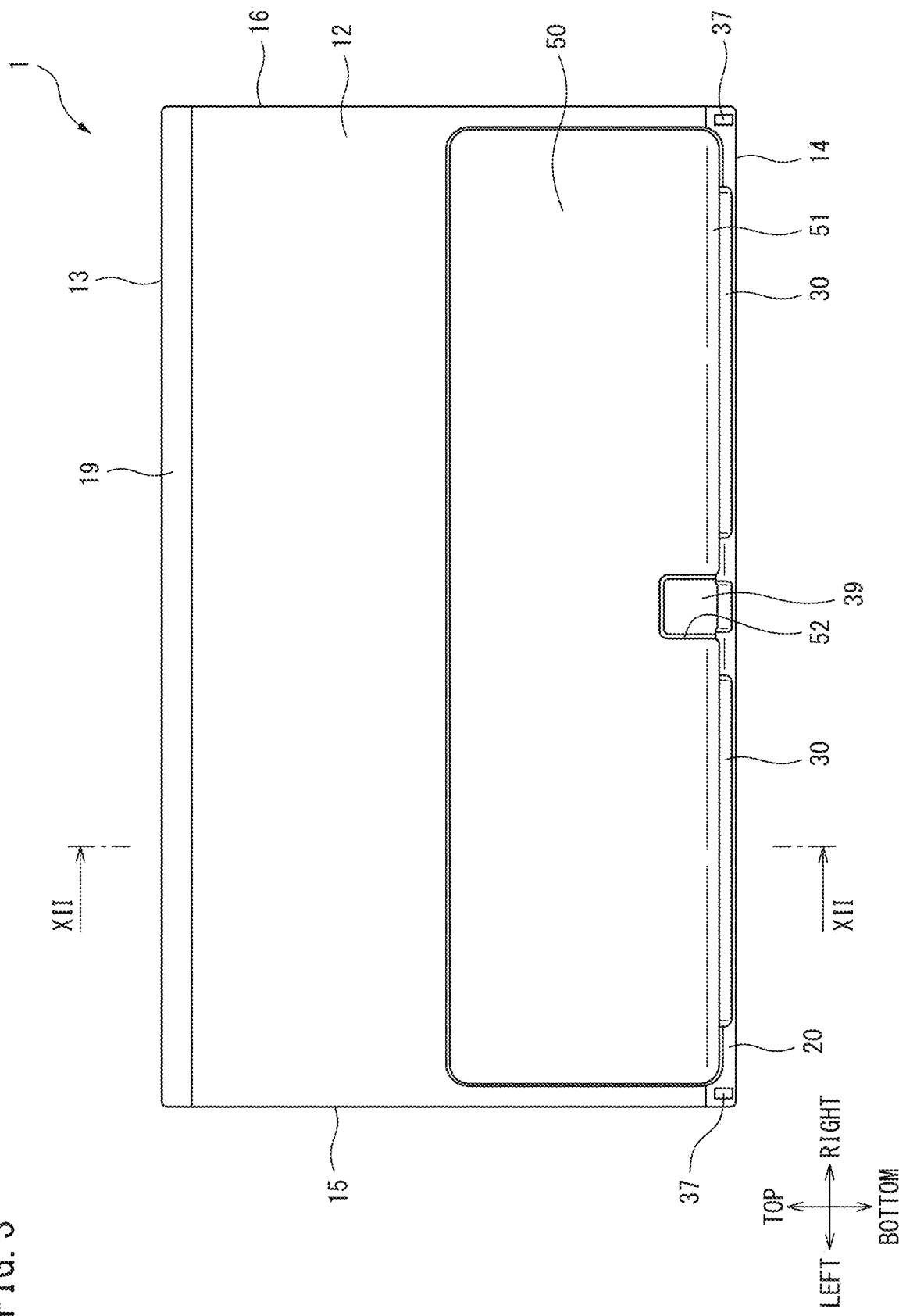
FIG. 3 is a back view of the electronic device when a stand is in a closed state.
Figure 4:
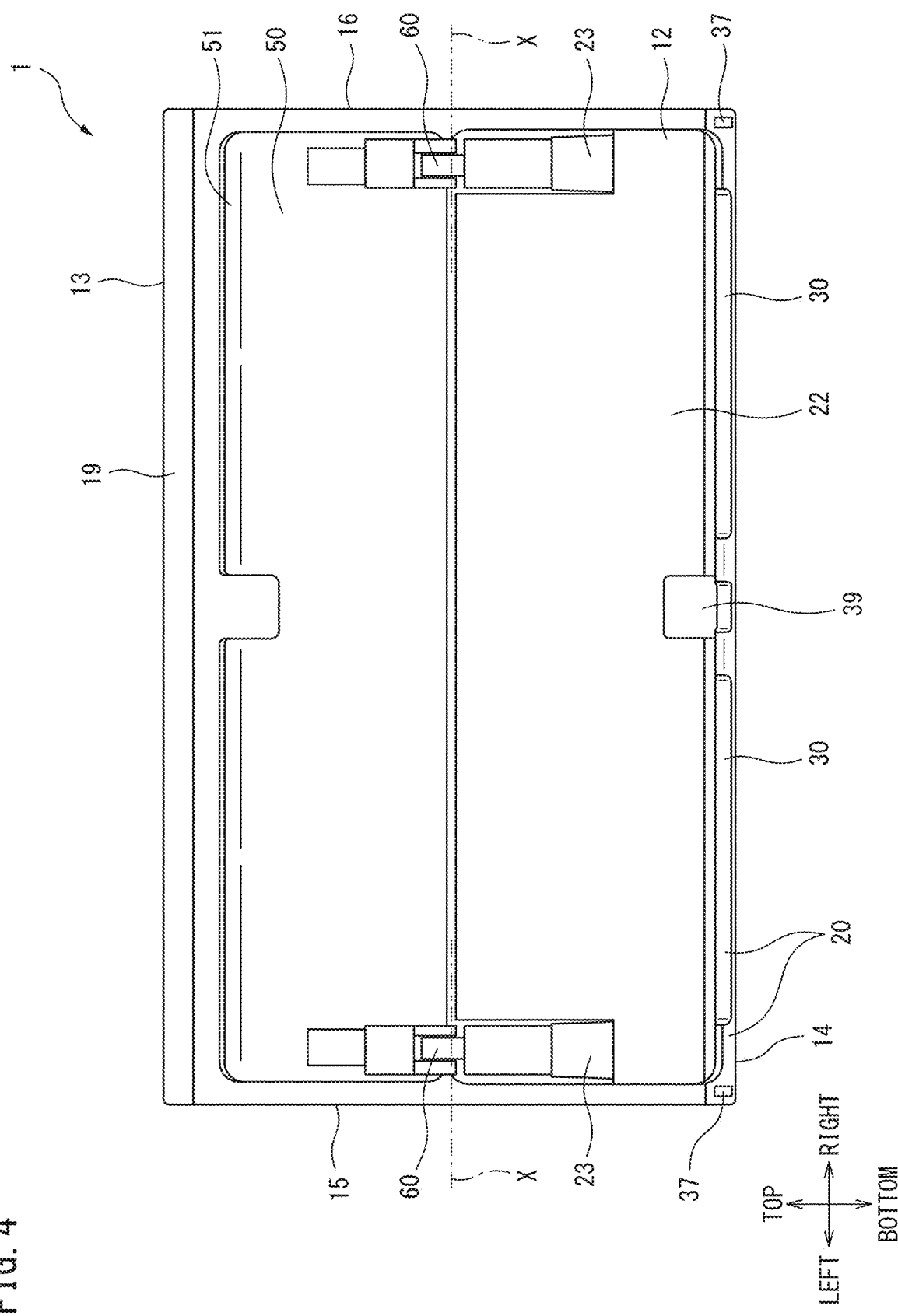
FIG. 4 is a back view of the electronic device when the stand is in a most open state.
Figure 5:
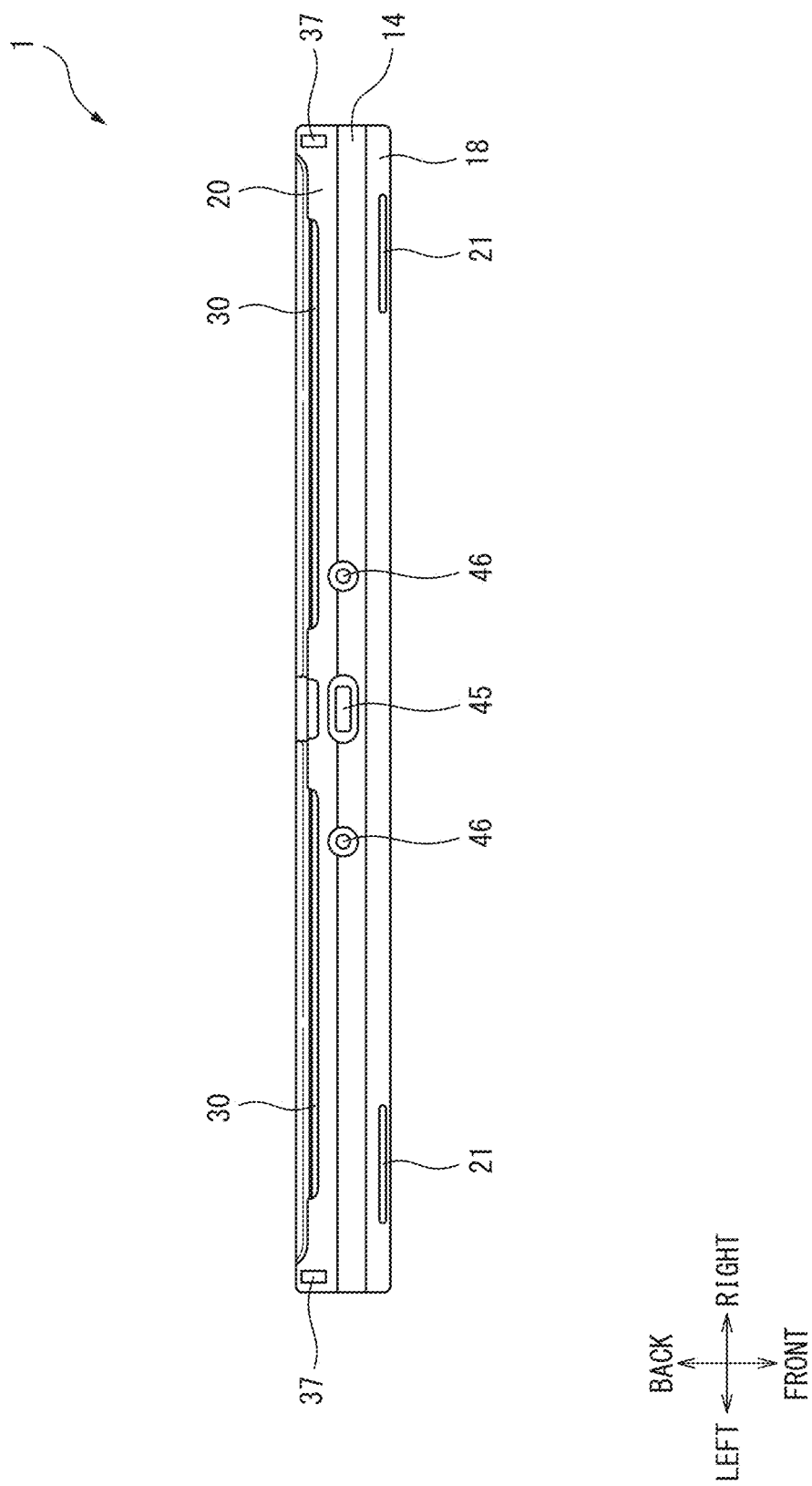
FIG. 5 is a bottom view of the electronic device when the stand is in a closed state.
Figure 6:
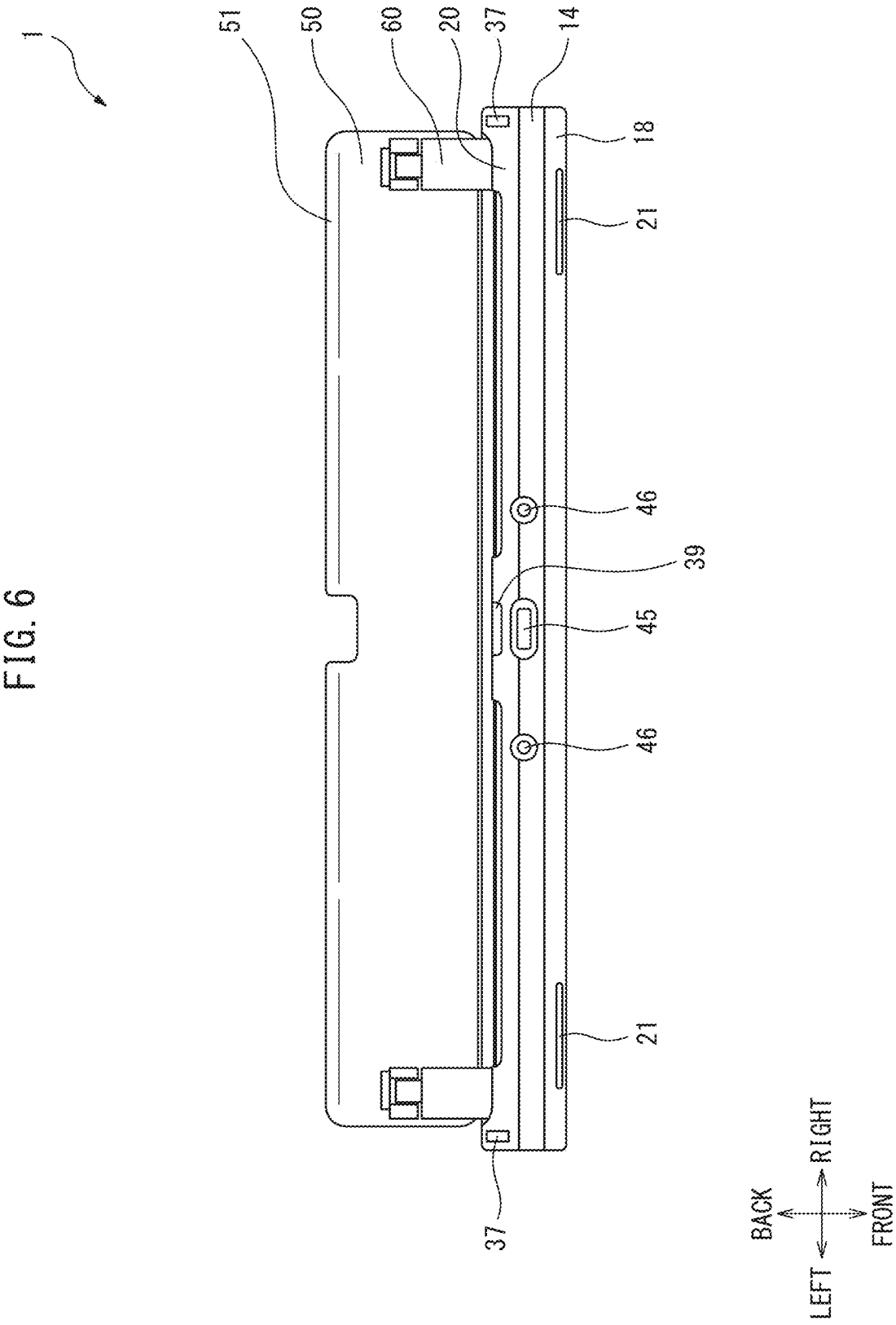
FIG. 6 is a bottom view of the electronic device when the stand is in a most open state.

FIG. 1 is a perspective view of the electronic device 1 seen from below and the back, FIG. 2 is a front view of the electronic device 1, FIGS. 3 and 4 are back views of the electronic device 1, FIGS. 5 and 6 are bottom views of the electronic device 1, and FIGS. 7 and 8 are side views of the electronic device 1 seen from the left side. FIGS. 3, 5, and 7 show cases where the later explained stand is in the closed state, while FIGS. 4, 6, and 8 show cases where the stand is in the most open state.

As mainly shown in FIGS. 1 to 3, the electronic device 1 has a substantially cuboid-shaped housing 10, a display 40 provided on one broad surface of the housing 10, and a stand 50 provided at the broad surface of the housing 10 at the opposite side to the broad surface where the display 40 is provided.

In this Description, the direction in which the display 40 is provided with respect to the housing 10 will be referred to as the "front", while the direction in which the stand 50 is provided with respect to the housing 10 will be referred to as the "back". Therefore, display 40 is provided at the front surface of the housing 10, while the stand 50 is provided at the back surface of the housing 10. Further, when the electronic device 1 is placed standing up perpendicularly with respect to the placement surface in a normal orientation, and the electronic device 1 is viewed from the back, the upper direction, lower direction, left direction, and right direction will be respectively referred to as the "top", "bottom", "left", and "right" of the electronic device 1 and its components. Further, the left-right direction of the electronic device 1 will also be referred to as the "lateral width direction".

Configuration of Housing

As mainly shown in FIGS. 1 to 3, the housing 10 has a front wall 11 provided at a front side of the housing 10, a back wall 12 provided at a back side of the housing 10, and a top wall 13, bottom wall 14, left wall 15, and right wall 16 provided between the front wall 11 and back wall 12. In particular, the top wall 13 is provided at the upper side of the housing 10, the bottom wall 14 is provided at the lower side of the housing 10, the left wall 15 is provided at the left side of the housing 10, and the right wall 16 is provided at the right side of the housing 10. In the present embodiment, these top wall 13, bottom wall 14, the left wall 15, and the right wall 16 extend perpendicularly with respect to the front wall 11 and back wall 12. Note that, "extend perpendicularly" includes not only the wall extending strictly perpendicularly, but also extending substantially perpendicularly. Further, in the present embodiment, the front wall 11 and back wall 12 are formed flat. In addition, in the present embodiment, the top wall 13, bottom wall 14, left wall 15, and right wall 16 are also formed flat. Note that, "flat" includes not only the entirety being strictly flat, but also being substantially flat.

Further, as mainly shown in FIGS. 2, 7, and 8, the housing 10 has a front top transition wall 17 curved by a constant curvature between the front wall 11 and the top wall 13, and a front bottom transition wall 18 curved by a constant curvature between the front wall 11 and the bottom wall 14. In addition, as mainly shown in FIGS. 1, 3, 7, and 8, the housing 10 has a back top transition wall 19 curved by a constant curvature between the back wall 12 and the top wall 13, and has a back bottom transition wall 20 curved by a constant curvature between the back wall 12 and the bottom wall 14. In particular, in the present embodiment, the curvature of the front top transition wall 17 and the curvature of the front bottom transition wall 18 are substantially the same, while the curvature of the back top transition wall 19 and the curvature of the back bottom transition wall 20 are substantially the same. Further, the curvatures of the back top transition wall 19 and back bottom transition wall 20 are smaller than the curvatures of the front top transition wall 17 and the front bottom transition wall 18.

Note that, in the present embodiment, the transition walls 17 to 20 are curved. However, the front top transition wall 17 and the front bottom transition wall 18 may be shaped in any way so long as extending more to the back as positioned further away from the front wall 11. Similarly, the back top transition wall 19 and the back bottom transition wall 20 may be shaped in any way so long as extending more to the front as positioned further away from the back wall 12. Therefore, for example, the back bottom transition wall 20 may be a wall slanted from the back wall 12 and bottom wall 14 by a constant angle (for example, 45°) or may be a wall parallel to the back wall 12 shifted to the front direction by a predetermined distance from the back wall 12.

Further, in the present embodiment, transition walls are provided between the front wall 11 and the top wall 13 and bottom wall 14 and between the back wall 12 and the top wall 13 and bottom wall 14. However, as long as a back bottom transition wall 20 is provided at least between the back wall 12 and the bottom wall 14, the other transition walls need not be provided. In this case, for example, the front wall 11 and the top wall 13, and the front wall 11 and the bottom wall 14 are directly connected so as to form right angle edge. Further, in the present embodiment, transition walls are not provided between the front wall 11 and the left wall 15, between the front wall 11 and right wall 16, between the back wall 12 and the left wall 15 and between the back wall 12 and right wall 16, but transition walls may also be provided between them.

Front Wall of Housing and Display

As shown in FIG. 2, the display 40 is arranged at the front wall 11. In the present embodiment, the display 40 is provided over substantially the entire surface of the front wall 11 and has a flat surface. The display 40 is a device displaying a still image or moving image, in accordance with a signal output from a video control device (not shown) provided inside the electronic device 1. The display 40 is, for example, a liquid crystal display, EL (Electro Luminescence) display, or plasma display. The display 40 may also be provided on its surface with a touch panel functioning as an input device.

Further, as shown in FIGS. 2 and 5, the front bottom transition wall 18 is provided with speaker holes 21 passing through the front bottom transition wall 18. Therefore, the speaker holes 21 are provided at the housing 10 below the display 40. In the present embodiment, the front bottom transition wall 18 is provided with a total of two speaker holes 21—one each to the left and right. The left side speaker hole 21 is arranged in proximity to the left wall 15, while the right side speaker hole 21 is arranged in proximity to the right wall 16.

At the inside of the housing 10 positioned at the back of the regions where the speaker holes 21 are provided, speaker spaces (not shown) closed off except for the speaker holes 21 are formed. Further, speakers (not shown) are provided in the housing 10 of these regions, so as to be exposed to the speaker spaces. Therefore, the speaker holes 21 are used for taking out sound generated by the speakers to the outside of the housing 10.

Note that, in the present embodiment, the speaker holes 21 are provided at the front bottom transition wall 18, but they may also be provided at the front wall 11. In this case, the speaker holes 21 are, for example, arranged below or to the side of the display 40. Further, in this case as well, one each of the speaker holes 21 may be arranged at the left and right in proximity to the left wall 15 and the right wall 16.

Side Walls of Housing

The side walls including the top wall 13, the bottom wall 14, the left wall 15, and the right wall 16 can, for example, be provided with operating buttons and other input members (not shown). In addition, in the present embodiment, the electronic device 1 may be configured to be able to communicate with a separate operation input device such as a controller. In this case, the separate operation input devices may be formed to be able to be attached to the left wall 15 and the right wall 16 of the housing 10, and fastening members for attaching operation input devices (for example, rails) may also be provided at the left wall 15 and the right wall 16 of the housing 10.

In addition, the side walls including the top wall 13, the bottom wall 14, the left wall 15, and the right wall 16 can be provided with slots for insertion of a memory card or other storage medium, female connectors (ports or receptacles) into which male connectors are inserted for connection of other devices (for example, headphones, microphone, other display, etc.), or the like. The connectors may be USB or other types of connectors based on general standards, or may be types of connectors based on unique standards.

In the present embodiment, as mainly shown in FIGS. 1, 5, and 6, the bottom wall 14 has a female connector 45 at the substantial center of the lateral width direction. In addition, in the present embodiment, the bottom wall 14 has positioning groove parts 46 separated from the female connector 45 at the left and right sides of the female connector 45. The positioning groove parts 46 are formed into conical or frustoconical shapes, and are used for positioning the electronic device 1 with respect to the later explained device holding apparatus 100 when the electronic device 1 is being placed on the device holding apparatus 100.

Back Wall of Housing and Stand

As mainly shown in FIGS. 1, 3, and 4, the stand 50 is provided on the back wall 12. The stand 50 is used for supporting the housing 10 in a state at an angle with respect to the placement surface. In the Description, the orientation of the stand 50 will be explained based on the time when the stand 50 is in the later explained closed state (when in state shown in FIG. 1). Therefore, the region of the stand 50 overlapping the back bottom transition wall 20 positioned below the back wall 12 when the stand 50 is in the closed state shown in FIG. 1 will be referred to as the "bottom end part 51 of the stand 50".

The stand 50, as mainly shown in FIGS. 1, 3, and 8, is formed into a substantially flat single plate shape. The length of the stand 50 in the top-bottom direction (length of stand 50 in top-bottom direction of the housing 10, when the stand 50 is in the later explained closed state) may be a length of 30 to 90% of the length of the housing 10 in the top-bottom direction, or may be a length of 40 to 70% of the same. Note that, in the present embodiment, it is a length of half (50%) of the length of the housing 10 in the top-down direction. Further, the length of the stand 50 in the lateral width direction may be greater than or equal to half the length of the housing 10 in the lateral width direction, or may be greater than or equal to 70%. In the present embodiment, it is about 90% of the length of the housing in the lateral width direction. The stand 50 is arranged so as to be positioned at the left and right sides from the center in the lateral width direction of the housing 10. In the present embodiment, it is arranged so as to be symmetric with respect to the center plane in the lateral width direction of the housing 10.

As shown in FIGS. 4, 6, and 8, the stand 50 is attached to the housing 10 by hinge members 60. In the present embodiment, the hinge members 60 attach the stand 50 to the housing 10 so that the stand 50 can swing about a swing axis X (FIG. 4) extending in the lateral width direction near the top end of the stand 50. As shown in FIG. 4, in the present embodiment, the electronic device 1 is provided with two hinge members 60. One of the hinge members 60 is fixed to the front surface of the stand 50 at the upper part of the left end of the stand 50 and is fixed to the back wall 12 of the housing 10 at the left side of the center in the top-down direction of the housing 10. The other of the hinge members 60 is fixed to the front surface of the stand 50 at the upper part of the right end of the stand 50 and is fixed to the back wall 12 of the housing 10 at the right side of the center in the top-down direction of the housing 10. Note that, in FIG. 4, the stand 50 is opened and the orientation of the stand 50 is opposite to that in the closed state, therefore the bottom side of the stand 50 appears to be fixed to the hinge members 60 in the drawing.

The stand 50 swings by the hinge members 60 between a closed state where the stand 50 approaches the back wall of the housing 10 and an open state where the bottom end part 51 of the stand 50 moves away from the back wall of the housing 10 so as to enable support of the housing 10 in a state at an angle with respect to the placement surface.

FIGS. 1, 3, 5, and 7 show the electronic device 1 when the stand 50 is in a closed state. As will be understood from these figures, when in a closed state, the stand 50 is positioned so that the back surface of the stand 50 is flush with the back surface of the back wall 12 of the housing 10 in the regions not covered by the stand 50. When the stand 50 is in the closed state, the front surface of the stand 50 at least partially contacts the back wall 12 of the housing 10 or the back bottom transition wall 20, and therefore the stand 50 cannot be swung further to the front direction than that.

FIGS. 4, 6, and 8 show the electronic device 1 when the stand 50 is in the open state, in particular the most open state. As will be understood from these figures, in the open state, the stand 50 is swung by any angle α (FIG. 8) about the swing axis X with respect to the closed state. In the present embodiment, in the most open state, the stand 50, as shown in FIG. 8, is swung by about 150° (maximum angle) with respect to the closed state. Further, in the present embodiment, the hinge members 60 are hinges able to hold the stand 50 at any swing angle up to the maximum angle, for example, are torque hinges. However, when the swing angle is for example less than or equal to a small predetermined angle of for example 30°, the hinge members 60 may be configured so that the stand 50 returns to the closed state on its own.

Note that, in the present embodiment, the electronic device 1 is provided with only a single plate-shaped stand 50. However, the electronic device 1 may also have a plurality of stands 50 split in the lateral width direction. However, in this case as well, the stands 50 are formed so that the total length in the lateral direction of all of the plurality of stands 50 is greater than or equal to half the length in the lateral width direction of the housing 10, or greater than or equal to 70% of the same.

Further, the stand 50 may be attached to the housing 10 by any mode so long as it can move between a closed state where the stand 50 approaches the back wall of the housing 10 and an open state where the bottom end part of the stand 50 moves away from the back wall of the housing 10 so as to enable support of the housing 10 in a state at an angle with respect to the placement surface. Therefore, for example, the stand 50 may also be attached to the left wall 15 and the right wall 16 by hinge members fixed to the left wall 15 and the right wall 16 of the housing 10. Further, in the illustrated embodiment, the two hinge members 60 enabled the stand 50 to swing about the same swing axis at the left and right, but the two hinge members 60 may also enable the stand 50 to swing about swing axes offset, for example, in the top-bottom direction, at the left and right. Further, fixed swing axes need not be set either. Further, instead of the hinge members 60, a movement mechanism enabling the stand 50 to move in parallel in the front-back direction may also be provided.

Further, as mainly shown in FIG. 4, the back wall 22 of the housing 10 is provided with a depressed part 22. The depressed part 22 has a size substantially the same as the stand 50 in the lateral width direction and the top-bottom direction. In the present embodiment, the length of the depressed part 22 in the lateral width direction is slightly larger than the length of the stand 50 in the lateral width direction. On the other hand, in the present embodiment, the length of the depressed part 22 in the top-bottom direction is smaller than the length of the stand 50 in the top-bottom direction. Further, the depressed part 22 extends to the bottom edge of the back wall 12. Further, the depth of the depressed part 22 in the front-back direction of the housing 10 is substantially the same as the thickness of the stand 50 and is slightly larger than the thickness of the stand 50.

In addition, the depressed part 22 has hinge housing parts 23 formed with depths 22 deeper than the other regions of the depressed part 22. The hinge housing parts 23 are arranged at positions facing the hinge members 60 when the stand 50 is in the closed state. Further, the hinge housing parts 23 house the hinge members 60 when the stand 50 is in the closed state.

In the present embodiment, when the stand 50 is in the closed state, the stand 50 is positioned to fit inside the depressed part 22. In particular, in the present embodiment, when the stand 50 is in the closed state, the stand 50 is arranged so that the back surface of the back wall 12 of the housing 10 other than the depressed part 22 and the back surface of the stand 50 are substantially flush. However, as explained above, the length of the depressed part 22 in the top-bottom direction is smaller than the length of the stand 50 in the top-bottom direction, and the depressed part 22 extends to the bottom edge of the back wall 12, therefore when the stand 50 is in the closed state, the bottom end part 51 of the stand 50 extends further downward than the back wall 12 and is positioned on the back bottom transition wall 20.

Configuration of Back Bottom Transition Wall

Figure 9:
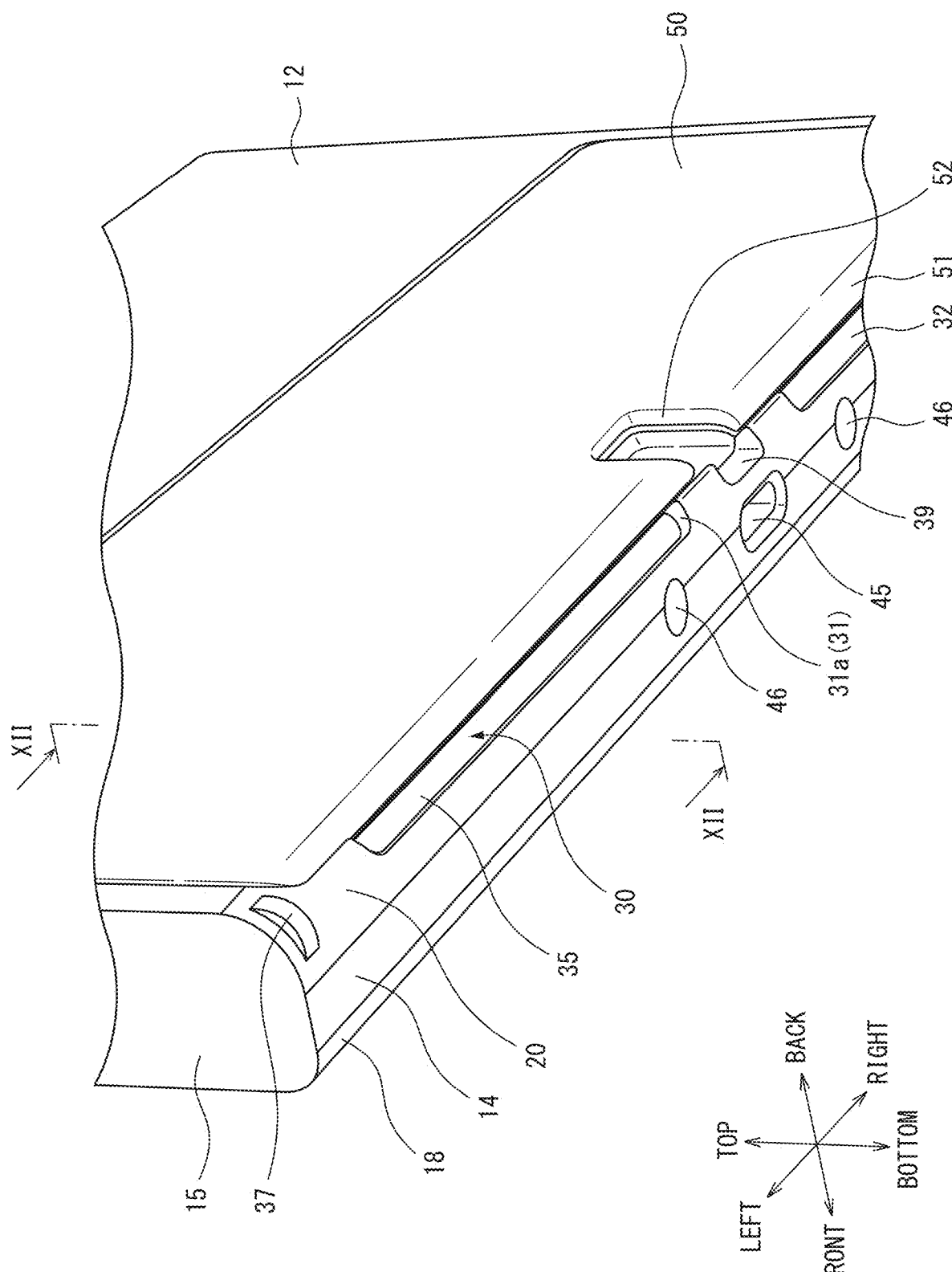
FIG. 9 is an enlarged perspective view of the electronic device seen from below and the back when the stand is in a closed state.
Figure 10:
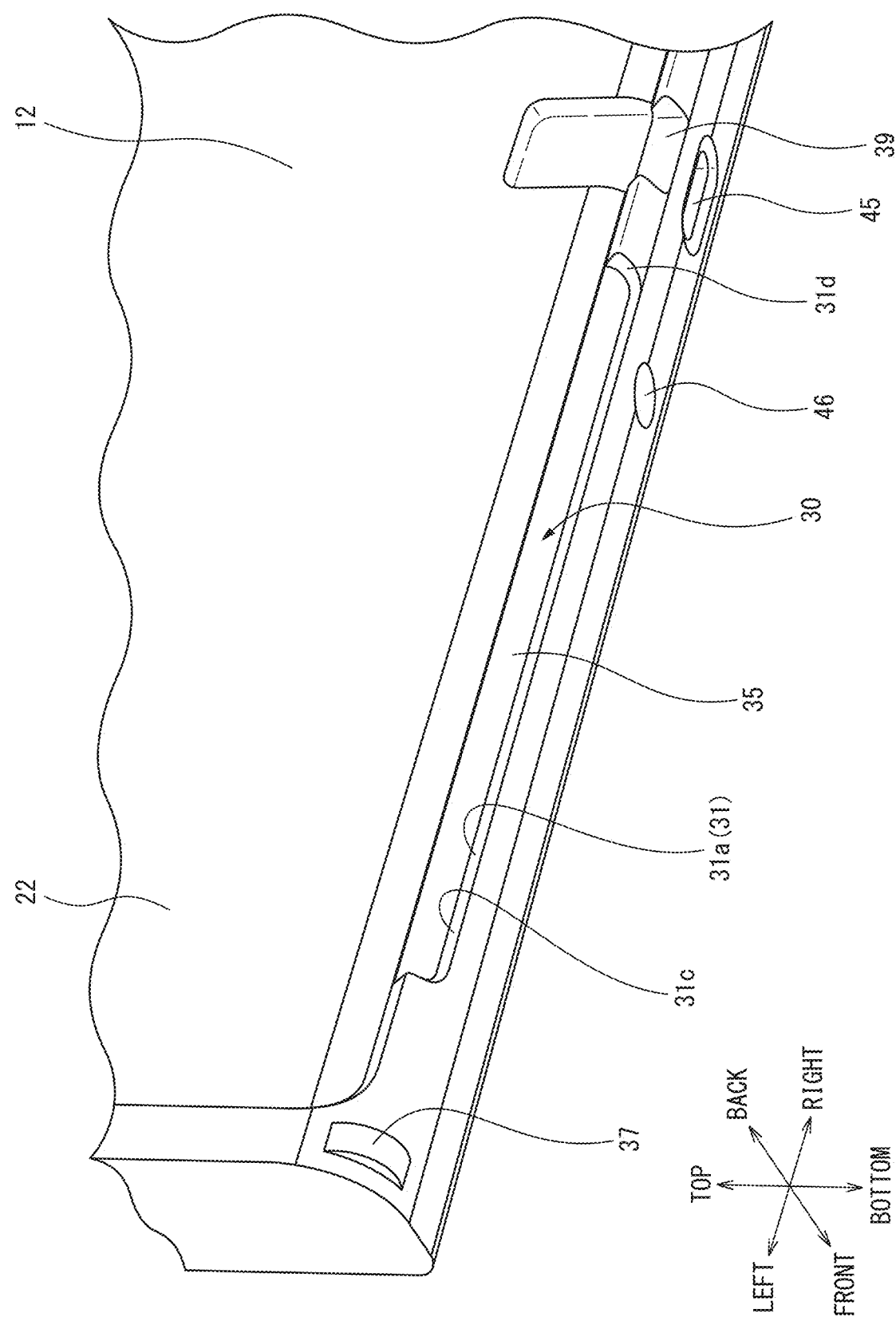
FIG. 10 is an enlarged perspective view of the electronic device seen from below and the back when the stand is in an open state.
Figure 11:
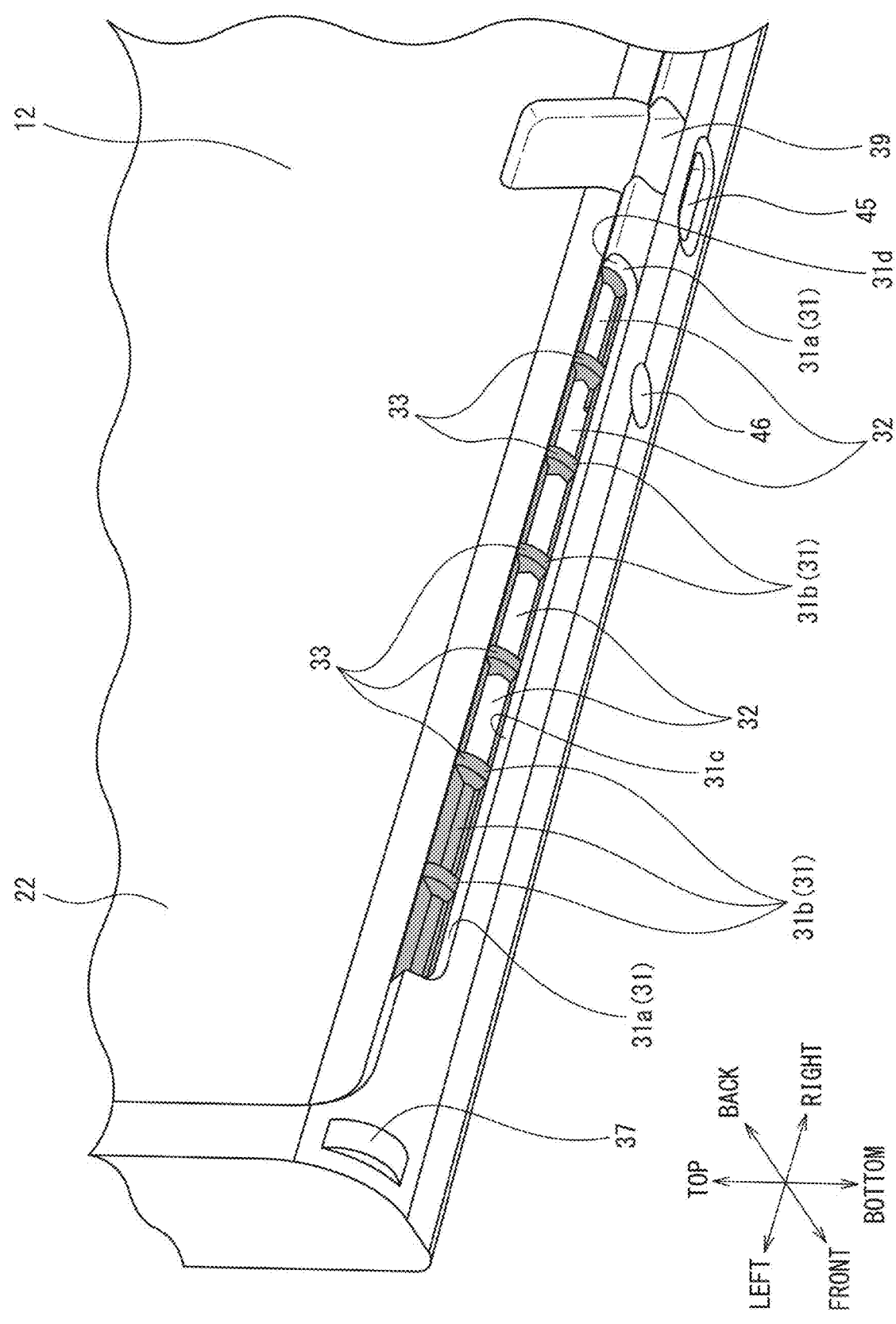
FIG. 11 is an enlarged perspective view of the electronic device seen from below and the back when the stand is in an open state and mesh members are removed.
Figure 12:
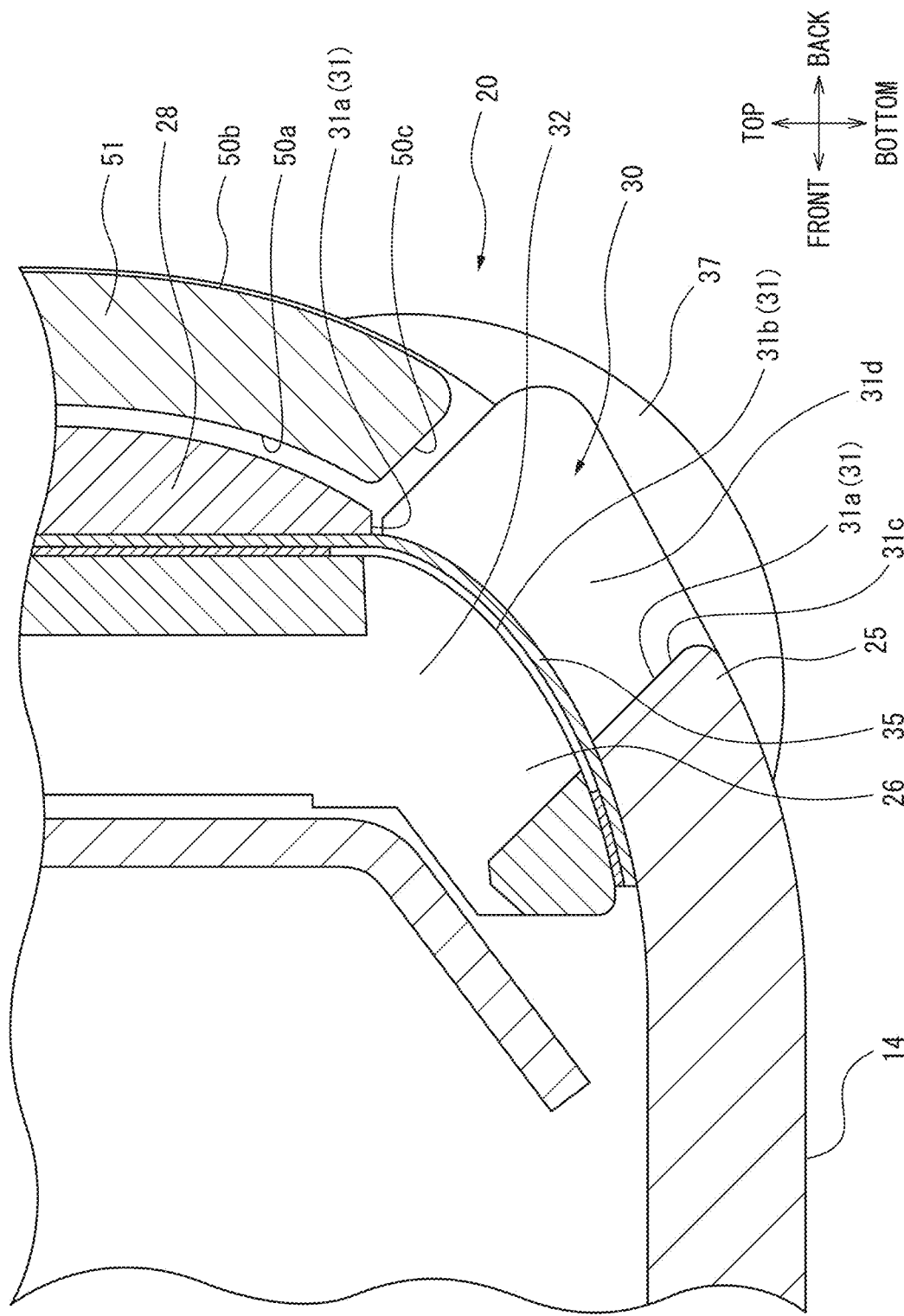
FIG. 12 is a cross-sectional view along the line XII-XII in FIGS. 1, 3, and 9.
Figure 13:
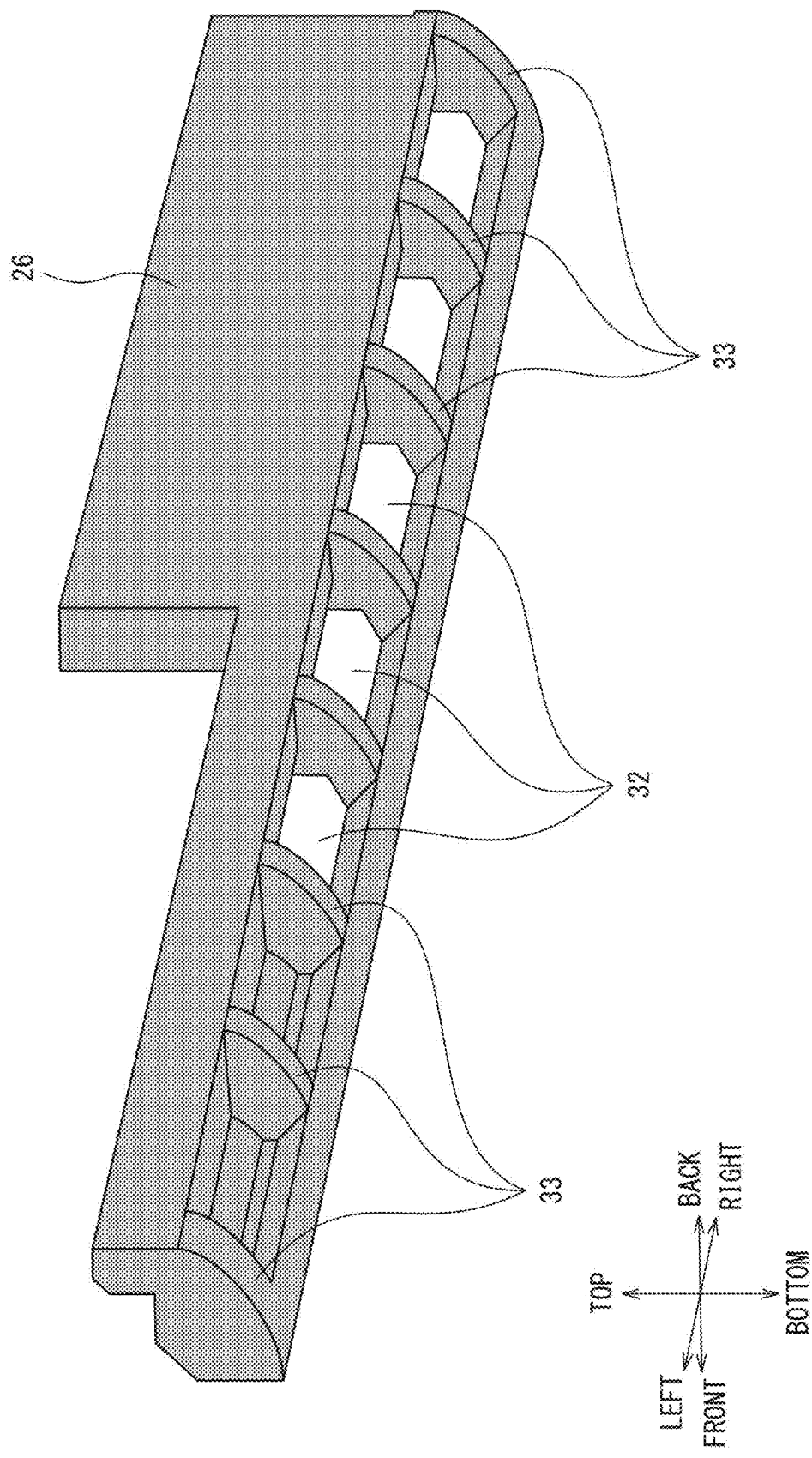
FIG. 13 is a perspective view of an inside member.

Next, referring to FIGS. 9 to 13, the configuration of the back bottom transition wall 20 and the configuration of the bottom end part 51 of the stand 50 will be explained. FIGS. 9 to 11 are enlarged perspective views of the electronic device 1 seen from below and the back. FIG. 9 shows the state where the stand 50 is in the closed state, while FIGS. 10 and 11 show the state where the stand 50 is open and not on the depressed part 22. Furthermore, FIG. 10 shows the state where mesh members are attached, while FIG. 11 shows the state where the mesh members are detached. Further, FIG. 12 is a cross-sectional view along the line XII-X11 in FIGS. 1, 3, and 9. In addition, FIG. 13 is a perspective view of an inside member 26.

As shown in FIGS. 9 and 10, the back bottom transition wall 20 has recessed parts 30 and projecting parts 37. The recessed parts 30 are parts depressed toward the inside of the housing 10 more than the outsides of the recessed parts 30 in the lateral width direction. In the present embodiment, the recessed parts 30 are parts depressed toward the inside of the housing 10 more than the parts of the back bottom transition wall 20 other than the recessed parts 30 in the lateral width direction. Further, the projecting parts 37 are parts sticking out toward the outside of the housing 10 more than parts of the back bottom transition wall 20 other than the projecting parts 37. Further, the mesh members 35 are arranged on the bottom surface defining walls 31b (explained later) of the recessed parts 30.

In the present embodiment, as shown in FIGS. 1 and 3 to 6, the recessed parts 30 are provided one each at the both sides with respect to the center in the lateral width direction of the housing 10. Accordingly, the back bottom transition wall 20 is provided with a total of two recessed parts 30. Each of the recessed parts 30 extends in the lateral width direction of the housing 10. Further, the two recessed parts 30 are positioned on the straight line extending in the same lateral width direction on the back bottom transition wall 20, in particular, in the present embodiment, are positioned in the lateral width direction with respect to each other.

The length in the lateral width direction of the left side recessed part 30 may be greater than or equal to half and less than or equal to 90% of the length in the lateral width direction of the left half part of the back bottom transition wall 20, or may be greater than or equal to 60% and less than or equal to 80% thereof. In the present embodiment, it is about 70%. Similarly, the length in the lateral width direction of the right side recessed part 30 may be greater than or equal to half and less than or equal to 90% of the length in the lateral width direction of the right half part of the back bottom transition wall 20, or may be greater than or equal to 60% and less than or equal to 80% thereof. In the present embodiment, it is about 70% thereof. Therefore, the recessed parts 30 as a whole may be greater than or equal to half and less than or equal to 90% of the length in the lateral width direction of the housing 10, may be greater than or equal to 60% and less than or equal to 80% thereof, or may be about 70% thereof. In the present embodiment, the length in the lateral width direction of the left side recessed part 30 is the same as the length in the lateral width direction of the right side recessed part 30.

Further, the recessed parts 30 are provided at the substantial center of the back bottom transition wall 20 in the circumferential direction of the curved back bottom transition wall 20 (that is, in the direction along the surface of the back bottom transition wall 20 in the top-bottom direction and front-back direction of the back bottom transition wall 20). In the present embodiment, the left side recessed part 30 and the right side recessed part 30 are provided at the same positions in the circumferential direction of the back bottom transition wall 20, and have the same lengths. In particular, in the present embodiment, the two recessed parts 30 are formed so as to be symmetric about the center plane in the lateral width direction of the housing 10.

As shown in FIGS. 9 to 12, the recessed parts 30 are defined by the recess defining walls 31 provided at the back bottom transition wall 20. The recess defining walls 31 include side surface defining walls 31a defining side surfaces of the recessed part 30, and bottom surface defining walls 31b defining bottom surfaces of the recessed parts 30. The side surface defining walls 31a are provided around the bottom surface defining walls 31b, and include lower side surface defining walls 31c provided at the bottom of the bottom surface defining walls 31b, and lateral side surface defining walls 31d provided at the left and right of the bottom surface defining walls 31b (two sides in lateral width direction). The side surface defining walls 31a extend between the parts of the back bottom transition wall 20 other than the recessed parts 30 and the bottom surface defining walls 31b.

The recessed parts 30 extend, in the circumferential direction of the back bottom transition wall 20, over lengths enabling entry of human fingers. Therefore, the lengths of the recessed parts 30 between the lower side surface defining walls 31c and the top edges of the recessed parts 30 are, for example, 2 to 10 mm or 3 to 7 mm.

As shown in FIGS. 11 and 12, the bottom surface defining walls 31b are provided with pluralities of ventilation holes 32. The ventilation holes 32 are communicated with the recessed parts 30 and connect the inside and outside of the housing 10. The ventilation holes 32 are used for taking air into the housing 10 so as to cool the electronic parts inside the housing 10, or discharging air heated by the electronic parts inside the housing 10 to the outside of the housing 10. Note that, FIGS. 9 and 10 show the state where mesh members 35 are attached on the bottom surface defining walls 31b, therefore in FIGS. 9 and 10, the bottom surface defining walls 31b and ventilation holes 32 do not appear.

As shown in FIG. 11, in the present embodiment, the bottom surface defining walls 31b of the recessed parts 30 have pluralities of ribs 33 extending in the circumferential direction of the back bottom transition wall 20. The ribs 33 are arranged aligned in the lateral width direction. Further, between some adjoining ribs, ventilation holes 32 are formed. The spaces between the remaining adjoining ribs are closed.

In the present embodiment, eight ribs 33 are arranged at equal intervals in the lateral width direction at each recessed part 30. In relation to the six ribs 33 positioned at the center side in the lateral width direction of the housing 10, ventilation holes 32 are formed between the ribs 33. On the other hand, in relation to the three ribs 33 positioned at the outside in the lateral width direction of the housing 10 (the left wall 15 side or the right wall 16 side), the spaces between the ribs 33 are closed, therefore no ventilation holes 32 are formed between these ribs 33. In particular, in the present embodiment, at the front of the closed spaces between the ribs 33, closed speaker spaces are provided. Speaker holes 21 are arranged at the front of the speaker spaces. Therefore, the closed portions between the ribs 33 are positioned behind the portions of the front bottom transition wall 18 where the speaker holes 21 are provided.

Note that, in the present embodiment, the ribs 33 extend in the circumferential direction of the back bottom transition wall 20 (front-back direction and top-bottom direction), and are arranged at equal intervals in the lateral width direction. However, the ribs 33 may be of any shapes so long as able to define the bottom surfaces of the recessed parts 30 and formed with ventilation holes between them. Therefore, the ribs 33, for example, may be arranged so as to extend slanted with respect to the circumferential direction (having angles with respect to top-bottom direction or front-back direction), and may be arranged at different intervals from each other. Alternatively, the ribs 33 may be formed in lattice shapes. Further, depending on the shapes of the recessed parts 30, the ribs 33 may be formed to extend in the top-bottom direction, or may be formed to extend in the front-back direction.

Further, in the present embodiment, the bottom surface defining walls 31b are provided with ventilation holes 32. However, the ventilation holes may also be provided at other than the bottom surface defining walls 31b. Therefore, the ventilation holes may be provided at the side surface defining walls 31a rather than the bottom surface defining walls 31b or in addition to the bottom surface defining walls 31b.

Furthermore, in the present embodiment, the recess defining walls 31 have side surface defining walls 31a and bottom surface defining walls 31b, but the bottom surface defining walls 31b need not be provided. In this case, the recess defining walls 31 have only the side surface defining walls 31a, and the ventilation holes are provided instead of the bottom surface defining walls 31b. Whatever the case, the recess defining walls 31 and ventilation holes may be formed in any manner so long as the recessed parts 30 communicate with the ventilation holes.

As shown in FIGS. 9, 10, and 12, on the bottom surface defining walls 31b, mesh members 35 are arranged to cover the bottom surface defining walls 31b. The mesh members 35 are net-like members with holes finer than the ventilation holes formed at the back bottom transition wall 20. For example, they are formed from, for example, woven or nonwoven fabric made of plastic fibers. The mesh members 35 keep foreign matter from passing through the ventilation holes 32 and entering the housing 10. Note that, the mesh members 35 need not be provided.

The projecting parts 37, in the present embodiment, as shown in FIGS. 1 and 3 to 8, are provided one each at the two sides from the center of the housing 10 in the lateral width direction. Accordingly, the back bottom transition wall 20 is provided with a total of two projecting parts 37. The projecting parts 37 are provided at regions not covered by the stand 50 when the stand 50 is in the closed state so as to be exposed even when the stand 50 is in the closed state. The projecting parts 37 stick out in arc shapes from the surface of the back bottom transition wall 20 so as to contact the placement surface when the housing 10 is supported, using the stand 50, in a state at an angle from the placement surface. In the present embodiment, they are formed from rubber or another elastic material.

Note that, in the present embodiment, the back bottom transition wall 20, as shown in FIGS. 12 and 13, is formed by outside members 25, inside members 26, mesh members 35, and back wall members 28. The outside members 25 are members forming a large portions of the outside surface of the back bottom transition wall 20. Further, they form parts of the side surface defining walls 31a of the recessed parts 30 (left side surface defining walls, right side surface defining walls, and lower side surface defining walls). The inside members 26 are members arranged further at the inside of the housing 10 than the outside members 25, and define the bottom surface defining walls 31b. Therefore, the inside members 26, as shown in FIG. 13, have ribs 33 and ventilation holes 32. Further, the back wall members 28 are members forming the back wall 12 and form parts of the side surface defining walls 31a of the recessed parts (top side surface defining walls).

Further, as shown in FIGS. 4, 6, and 9, the back wall 12 and back bottom transition wall 20 of the housing 10 have a guide recessed part 39. The guide recessed part 39 is used for guiding the electronic device 1 with respect to the later explained device holding apparatus 100 when the electronic device 1 is being placed at the device holding apparatus 100.

The guide recessed part 39 is a part recessed further toward the front compared with parts of the back wall 12 other than the guide recessed part 39, and opens downward through the back bottom transition wall 20. Further, the guide recessed part 39 is formed extending further upward than the recessed parts 30. The guide recessed part 39 has a shape complementary with the guide projecting part 131 of the device holding apparatus 100, which will be later explained, and is formed slightly larger than the guide projecting part 131.

In the present embodiment, as mainly shown in FIGS. 1 and 4, a single guide recessed part 39 is provided at the substantial center in the lateral width direction of the housing 10. Therefore, the recessed parts 30 are provided at the both sides of the guide recessed part 39 in the lateral width direction of the housing.

Configuration of Bottom End Part of Stand

In the present embodiment, the stand 50, as shown in FIG. 12, has an inside surface 50a facing the back wall 12 and extending along the back wall 12 of the housing 10 when the stand 50 is in the closed state, an outside surface 50b facing the back direction of the housing 10 when the stand 50 is in the closed state, and a connecting surface 50c formed between the inside surface 50a and the outside surface 50b.

As will be understood from FIG. 12, the connecting surface 50c is formed so as to face the front direction of the housing 10. In particular, in the present embodiment, the connecting surface 50c is formed to extend at an acute angle with respect to the outside surface 50b. The boundary between the outside surface 50b of the stand 50 and the connecting surface 50c forms the bottom edge of the stand 50. By the bottom end part 51 of the stand 50 being formed in this way, the user can easily hook the connecting surface 50c of the stand 50 by his fingertip, when the user opens the stand 50 in the closed state.

Further, the connecting surface 50c is formed to be substantially parallel with the lower side surface defining walls 31c provided at the back bottom transition wall 20, when the stand 50 is in the closed state. Specifically, the connecting surface 50c is formed so as to be less than or equal to 15°, less than or equal to 10°, or less than or equal to 5° with respect to the lower side surface defining walls 31c, when the stand 50 is in the closed state.

Further, as shown in FIG. 12, the bottom end part 51 of the stand 50 covers part of the back bottom transition wall 20, when the stand 50 is in the closed state. In the present embodiment, when the stand 50 is in the closed state, the bottom end part 51 of the stand 50 partially overlaps the back bottom transition wall 20, when seen from the back. In the present embodiment, the bottom end part 51 of the stand 50 is curved so that when the stand 50 is in the closed state, it extends more to the front as further downwardly positioned, in particular, in the present embodiment, it follows the curve of the back bottom transition wall 20. By the bottom end part 51 being curved in this way, even if the connecting surface 50c is formed to face the front direction of the housing 10, the connecting surface 50c is not formed to that sharp acute angle. Accordingly, it becomes difficult to form a part with no thickness at the bottom end part 51 of the stand 50. Further, the stand 50 (in particular, the bottom end part 51 of the stand 50) covers only part of the back bottom transition wall 20, therefore there are regions not covered by the stand 50 at the back bottom transition wall 20.

In addition, in the present embodiment, as shown in FIG. 12, when the stand 50 is in the closed state, the bottom edge of the inside surface 50a of the stand 50 is positioned on the upper part of the side surface defining walls 31a of the recessed parts 30. Therefore, the connecting surface 50c of the stand 50 covers part of the recessed parts 30. In particular, in the present embodiment, the connecting surface 50c of the stand 50 covers the upper parts of the recessed parts 30 at the entire regions of the recessed parts 30 in the lateral width direction.

Further, as mainly shown in FIGS. 1, 3, and 9, the bottom end part 51 of the stand 50 is provided with a cutaway part 52 extending upward from the bottom edge of the stand 50 at the center in the lateral width direction. The cutaway part 52 is provided so as to overlap the guide recessed part 39 in the front-back direction, when the stand 50 is in the closed state. Therefore, the stand 50 is formed so as not to cover the guide recessed part 39 when it is in a closed state. In particular, in the present embodiment, the length in the lateral width direction of the cutaway part 52 is greater than the length in the lateral width direction of the guide recessed part 39. Therefore, when the stand 50 is in the closed state, the lateral width is narrower in steps from the rear toward the front from the cutaway part 52 to the guide recessed part 39.

Note that, in the present embodiment, the cutaway part 52 has a length in the lateral width direction greater than the length in the lateral width direction of the guide recessed part 39 over the entire length in the top-bottom direction. However, cutaway part 52 may also have a length in the lateral width direction greater than the length in the lateral width direction of the guide recessed part 39 at only a partial region in the top-bottom direction. Further, this partial region may be the upper region of the cutaway part 52 in the top-bottom direction or the lower region.

The bottom edge of the stand 50 extends straight in the lateral width direction except at the cutaway part 52. Therefore, in the present embodiment, at the bottom end part of the stand 50, the bottom edge of the stand 50 extends straight in the lateral width direction of the housing 10 at the regions covering the recessed parts 30 when the stand 50 is in the closed state.

Note that, in the present embodiment, when the stand 50 is in the closed state, the bottom edge of the inside surface 50a of the stand 50 is formed so as to be positioned on the upper part of the side surface defining walls 31a of the recessed parts 30. However, when the stand 50 is in the closed state, the bottom edge of the inside surface 50a of the stand 50 may be formed so as to be positioned below the upper part of the side surface defining walls 31a of the recessed parts 30. In this case as well, the bottom edge of the stand 50 (the bottom edge of the connecting surface 50c) has to be positioned above the lower prat of the side surface defining walls 31a of the recessed parts 30. Therefore, the bottom end part of the stand 50 does not have to cover the recessed parts 30 as a whole, but has to partially cover the recessed parts 30. In particular, in this case, the bottom edge of the stand 50 and the lower part of the side surface defining walls 31a of the recessed parts 30 preferably are separated by a length enough for a fingertip of a user to enter in the top-bottom direction and front-back direction.

Advantageous Effects

In the present embodiment, the ventilation holes 32 are formed at the recessed parts 30 formed at the back bottom transition wall 20. By providing the ventilation holes 32 at the recessed parts 30 formed at the back bottom transition wall 20 positioned at the front from the back wall 12 in this way, even when the electronic device 1 is placed on the placement surface with the back wall 12 facing down or when the electronic device 1 is placed on the placement surface with the bottom wall 14 facing down, the recessed parts 30 where the ventilation holes 32 are provided will no longer be closed overall by the placement surface.

Further, in the present embodiment, the bottom end part 51 of the stand 50 is formed so as to cover part of the back bottom transition wall 20, in particular to cover parts of the recessed parts 30. The back bottom transition wall 20 is positioned further at the front from the back wall 12, therefore the bottom edge of the stand 50 is positioned on the back bottom transition wall 20. Due to this, when the stand 50 is in the closed state, the user can easily hook the bottom edge of the stand 50 by his fingertip. Furthermore, the bottom end part 51 of the stand 50 covers parts of the recessed parts 30, therefore parts of the edge of the stand 50 are positioned on the recessed parts 30. Accordingly, the user can insert his fingertip into a recessed part 30 to easily hook the bottom edge of the stand 50 with his fingertip. In addition, the bottom end part 51 of the stand 50 is configured so as to cover not the entirety of the recessed parts 30 where the ventilation holes 32 are provided, but only parts, when the stand 50 is in the closed state, therefore even when the stand 50 is in the closed state, the ventilation holes 32 are kept from being closed by the stand 50.

Further, in the present embodiment, the recessed parts 30 extend over greater than or equal to half of the housing in the lateral width direction. Similarly, the stand 50 has a length of greater than or equal to half of the housing 10 in the lateral width direction. Therefore, a user can hook the bottom end part 51 of the stand 50 by his fingertip in a wide region of the lateral width direction. Further, the length in the lateral width direction of the stand 50 is long and, further, the stand 50 is arranged at the both sides from the center in the lateral width direction of the housing 10, therefore the housing 10 can be stably supported. In addition, the recessed parts 30 are provided at the both sides of the guide recessed part 39 provided at the center, therefore the recessed parts 30 are arranged at the both left and right sides of the housing 10 and, accordingly, the user can open the stand 50 by hooking the stand 50 by the fingertips at the both left and right sides of the housing 10.

Further, in the present embodiment, the bottom edge of the stand 50 extends straight in the lateral width direction of the housing 10. In addition, in the present embodiment, the bottom end part of the stand 50 is configured so as to cover the upper parts of the recessed parts 30 in all of the regions of the recessed parts 30 in the lateral width direction of the housing 10. For this reason, a user can access the bottom edge of the stand 50 in the same way from various positions in the lateral width direction.

Further, in the present embodiment, ventilation holes 32 are formed between some of the adjoining ribs 33, while the spaces between the remaining adjoining ribs 33 are closed and no ventilation holes 32 are formed. By making the cross-sectional areas of the ventilation holes 32 smaller in this way, it is possible to optimize the flow paths of the air.

Further, in the present embodiment, behind the closed speaker spaces connecting to the speaker holes 21, closed parts are provided between the ribs 33. Therefore, by arranging parts where no ventilation holes 32 are provided behind the speaker spaces into which air used for cooling is not allowed to flow, it is possible to optimize the space layout inside the housing 10.

Device Holding System

The above-mentioned electronic device 1 and the device holding apparatus 100 holding the electronic device 1 constitute a device holding system. The device holding apparatus 100 is used for holding the electronic device 1 and for charging the electronic device 1 or for communication between the electronic device 1 and another device.

Figure 14:
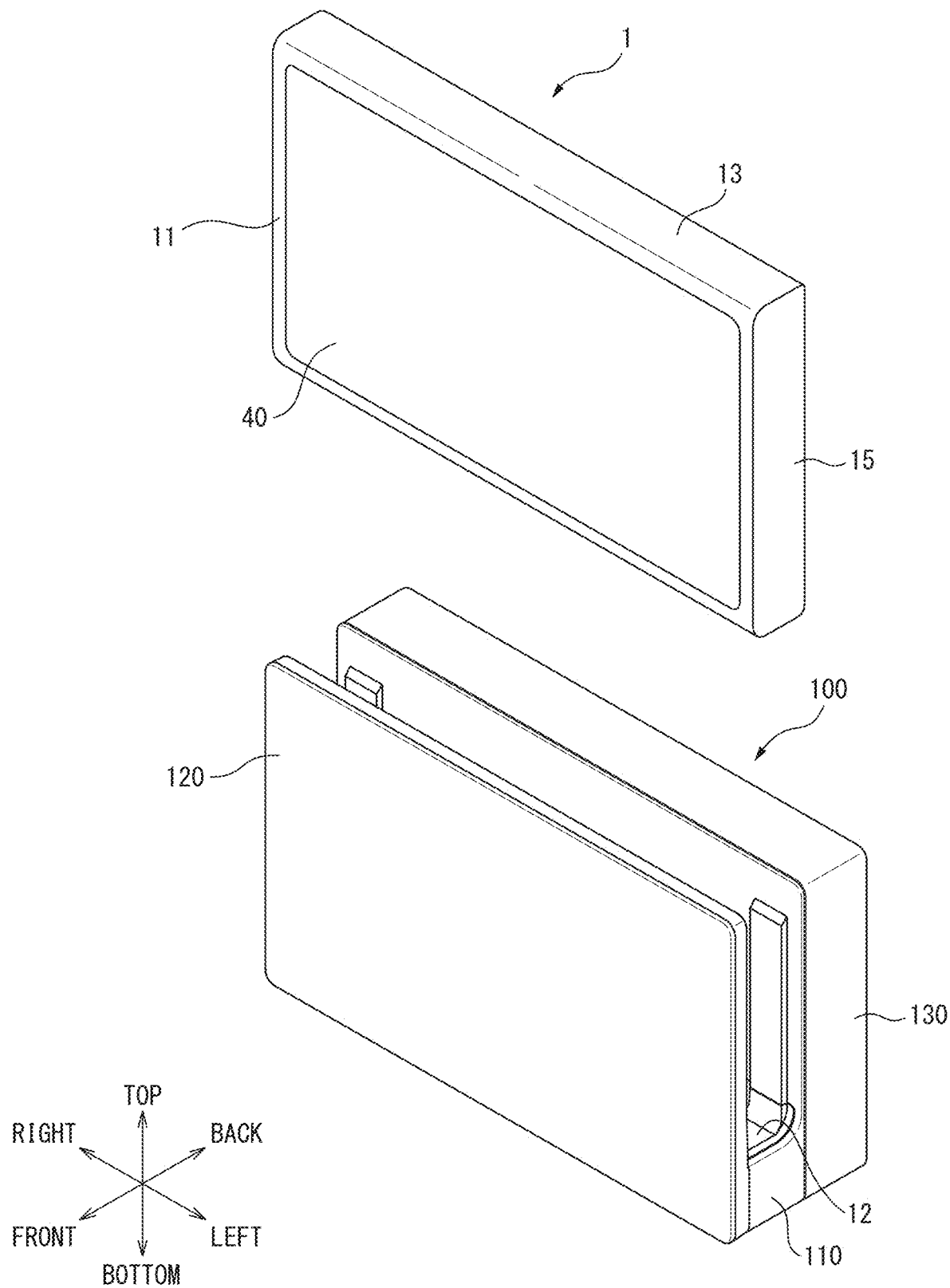
FIG. 14 is a perspective view of the front surfaces of an electronic device and device holding apparatus seen from above at an angle.
Figure 15:
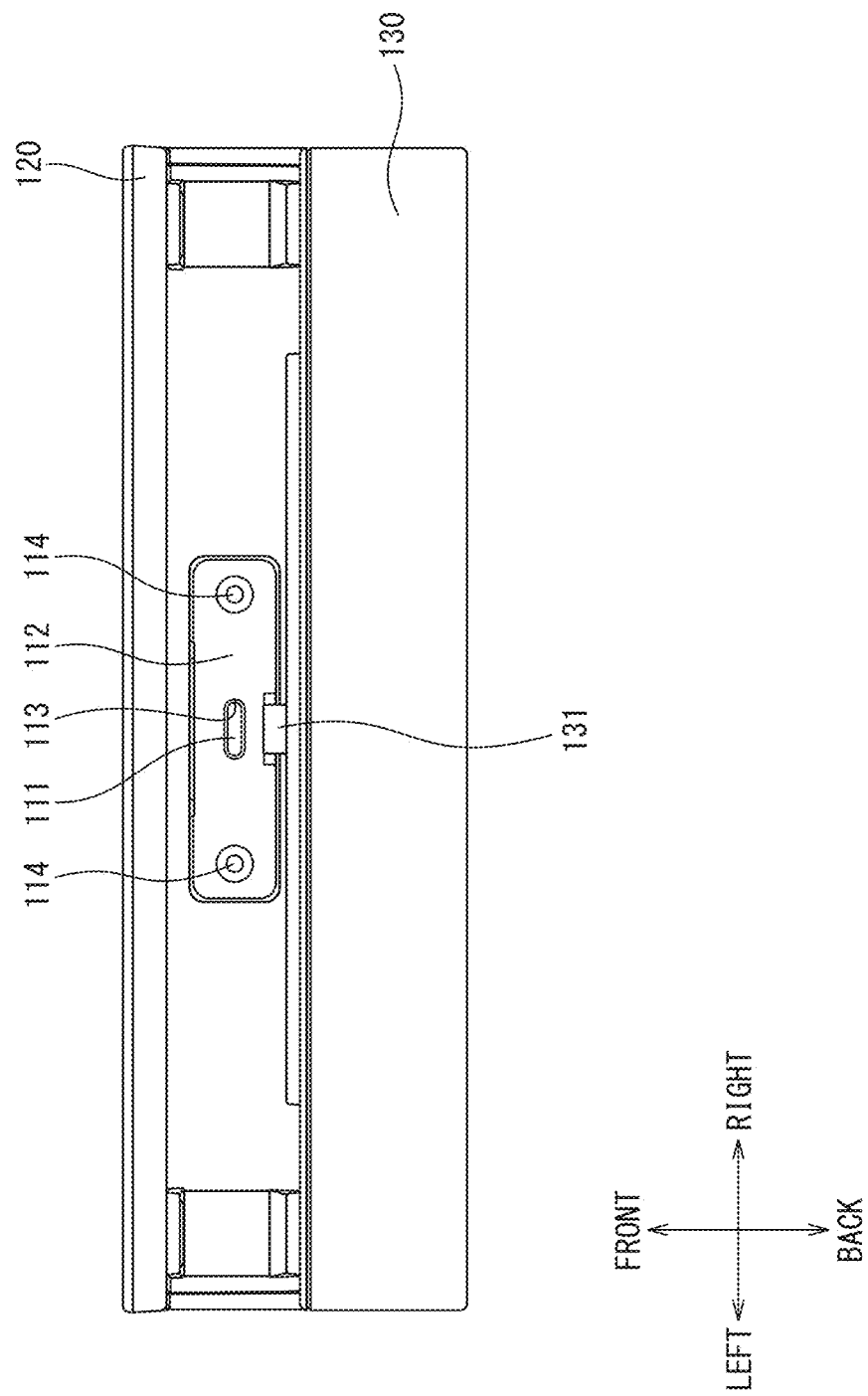
FIG. 15 is a plan view of the device holding apparatus.
Figure 16:
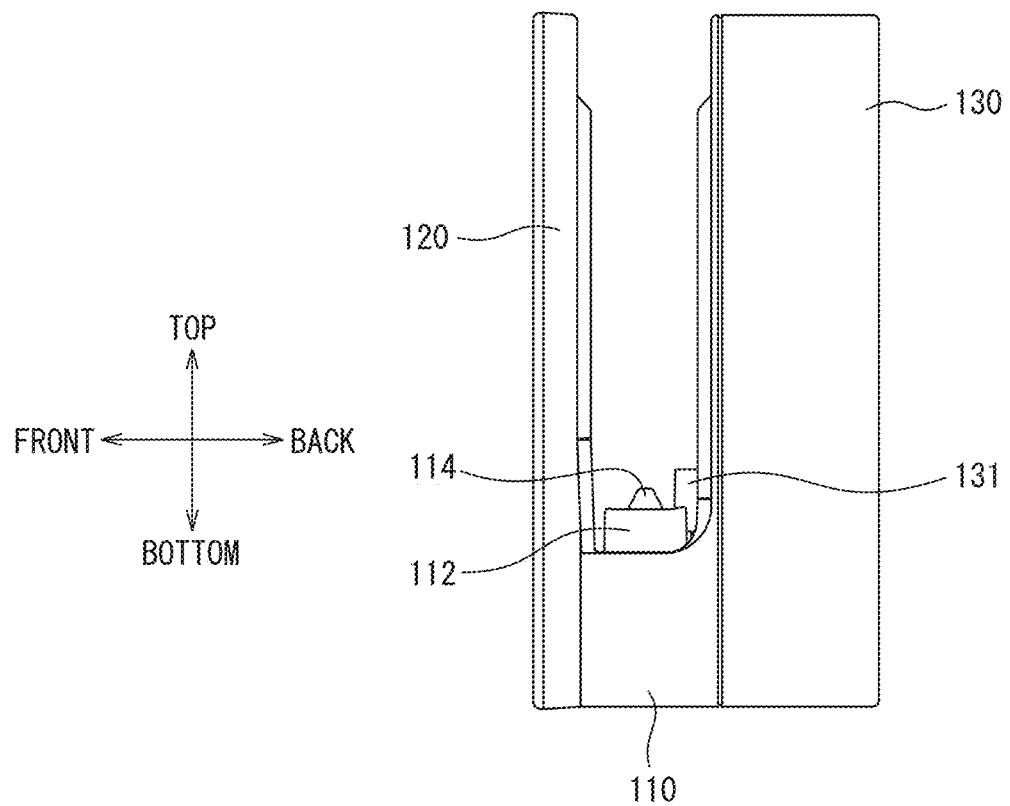
FIG. 16 is a left side view of the device holding apparatus.

Referring to FIGS. 14 to 16, the configuration of the device holding apparatus 100 will be explained. FIG. 14 is a perspective view of the front surfaces of the electronic device 1 and device holding apparatus 100 seen from above at an angle. FIG. 15 is a plan view of the device holding apparatus 100, and FIG. 16 is a left side view of the device holding apparatus 100.

As shown in FIGS. 14 to 16, the device holding apparatus 100 has a placement part 110 on which the electronic device 1 is placed, a front guide part 120 arranged at the front of the placement part 110, and a back guide part 130 arranged at the back of the placement part 110. Note that, the device holding apparatus 100 does not necessarily have to be provided with all of these components. For example, it need not have at least one of the front guide part 120 and back guide part 130.

The placement part 110 is the part on which the electronic device 1 is placed when the device holding apparatus 100 holds the electronic device 1. The placement part 110, as shown in FIG. 14, is formed so that the length in the lateral width direction is slightly larger than the length in the lateral width direction of the electronic device 1. As shown in FIGS. 15 and 16, the placement part 110 has, at the center of its top surface, a male connector 111 and a cover member 112 provided around the male connector 111.

The male connector 111 is a connector corresponding to the female connector 45 provided at the electronic device 1. For example, it is a connector based on the same standard as the female connector 45. The male connector 111 is used for connection with the female connector 45 to transfer of data between the electronic device 1 and the device holding apparatus 100 or an outside device, or to supply electric power to the electronic device 1. The male connector 111 is arranged to extend upward from the top surface of the placement part 110. Specifically, the male connector 111 is arranged so as to be inserted into the female connector 45 of the electronic device 1, when the electronic device 1 is held at the device holding apparatus 100. Further, the male connector 111 is fixed to the placement part 110 so as not to fall over in the lateral direction. Therefore, when inserted into the female connector 45 of the electronic device 1, the male connector 111 holds the electronic device 1.

The cover member 112 sticks out upward from the top surface of the placement part 110 and is arranged so as to cover the surroundings of the male connector 111. The cover member 112 is provided with a connector opening 113 at its center. Further, it is provided with conical or frustoconical projections 114 sticking out from the top surface of the cover member 112 at the both sides of the connector opening. The connector opening 113 is formed so as to enable the male connector 111 to pass through it. Further, the projections 114 are provided at positions corresponding to groove parts 46 of the electronic device 1 so as to enable positioning of the electronic device 1 in cooperation with the groove parts 46 when the electronic device 1 is being placed on the device holding apparatus 100. The cover member 112 is configured to be able to move in a top-bottom direction (direction of placement of electronic device 1 at device holding apparatus 100), and to cover the male connector 111 when the electronic device 1 is not being held at the device holding apparatus 100.

The front guide part 120 and back guide part 130 are respectively arranged at the front side and back side of the placement part 110, and extend beyond the placement part 110 in the upper direction. The front guide part 120 guides the front surface of the electronic device 1 when the electronic device 1 is being placed on the device holding apparatus 100. Further, the back guide part 130 guides the back surface of the electronic device 1 when the electronic device 1 is being placed on the device holding apparatus 100.

As shown in FIGS. 15 and 16, the front surface of the back guide part 130 is provided with a guide projecting part 131 sticking out to the front from the front surface of the back guide part 130. The guide projecting part 131 extends upward from the top surface of the placement part 110. Further, the guide projecting part 131 is provided at the substantial center of the back guide part 130 in the lateral width direction, and accordingly, is provided at a position corresponding to the guide recessed part 39 and cutaway part 52 when the electronic device 1 is held by the device holding apparatus 100.

The guide projecting part 131 has a shape complementing the guide recessed part 39 and cutaway part 52 provided at the electronic device 1, and is formed smaller than the guide recessed part 39 and cutaway part 52. Therefore, the guide projecting part 131 fits into the guide recessed part 39 and cutaway part 52 when the electronic device 1 is held by the device holding apparatus 100. Further, the guide projecting part 131 guides the guide recessed part 39 and cutaway part 52 of the electronic device 1 when inserting the electronic device 1 between the front guide part 120 and the back guide part 130 with the bottom surface facing downward so as to place the electronic device 1 at the device holding apparatus 100.

In the present embodiment, the guide projecting part 131 is provided at the substantial center in the lateral width direction of the device holding apparatus 100, while similarly the guide recessed part 39 is provided at the substantial center in the lateral width direction of the electronic device 1. For this reason, when placing the electronic device 1 on the device holding apparatus 100, the electronic device 1 is guided with respect to the device holding apparatus 100 at the substantial center in the lateral width direction. As a result, when the electronic device 1 is being placed on the device holding apparatus 100, the electronic device 1 can be suitably guided.

Note that, in the above embodiment, the device holding apparatus 100 holds the electronic device 1 in a state where the bottom surface of the electronic device 1 faces downward. However, device holding apparatus 100 may also hold the electronic device 1 in a state with the back surface of the electronic device 1 facing downward. In this case, when placing the electronic device 1 on the device holding apparatus 100, the electronic device 1 is inserted into the device holding apparatus 100 with its back surface facing down. As explained above, in the present embodiment, when the stand 50 is in the closed state, the lateral width becomes narrower in steps from the cutaway part 52 to the guide recessed part 39 from the back toward the front. By the lateral width being made narrower in steps in this way, the cutaway part 52 and guide recessed part 39 can suitably guide the electronic device 1 when the electronic device 1 is being placed on the device holding apparatus 100.

Above, preferred embodiments according to the present invention were explained, but the present invention is not limited to these embodiments and can be corrected and changed in various ways within the language of the claims.

The invention claimed is:

1. An electronic device comprising: a housing; a display positioned on a front surface side of the housing; and a stand positioned on a back surface side of the housing, wherein,
the housing has a back wall, a bottom wall, and an intermediate wall between the back wall and the bottom wall, as the intermediate wall extending further upwardly in a rearward direction from the bottom wall, the intermediate wall having a recessed part and a ventilation hole positioned in the recessed part to connect an inside of the housing and outside of the housing,
the stand is attached to the housing and configured to move between a closed state in which a bottom end part of the stand is positioned proximal to the back wall of the housing and an open state in which the bottom end part of the stand is positioned distal from the back wall of the housing to allow the stand to support the housing at an angle from a placement surface, and
the bottom end part of the stand forms an opening together with the recessed part when the stand is in the closed state.

2. The electronic device according to claim 1, wherein the bottom end part of the stand overlaps a portion of the recessed part in a front-rear direction, when the stand is in the closed state.

3. The electronic device according to claim 1, wherein the housing has a left wall and a right wall, and
wherein the back wall, the bottom wall, and the intermediate wall are positioned between the left wall and the right wall.

4. The electronic device according to claim 1, wherein the stand has an inside surface facing the back wall of the housing and extending along the back wall when the stand is in the closed state, an outside surface facing a back direction of the housing when the stand is in the closed state, and a connecting surface formed between the inside surface and outside surface of the stand and connecting the inside surface and the outside surface at a bottom of the stand, the connecting surface being formed so as to face a front direction of the housing when the stand is in the closed state.

5. The electronic device according to claim 4, wherein the connecting surface extends at an acute angle with respect to the outside surface of the stand.

6. The electronic device according to claim 4, wherein the intermediate wall has a recess defining wall, which defines the recessed part, the recess defining wall has a lower side surface defining wall defining a side surface at a bottom side of the recessed part, and the connecting surface is formed so as to be substantially parallel to the lower side surface defining wall when the stand is in the closed state.

7. The electronic device according to claim 1, further comprising a projecting part positioned on and extending away from the intermediate wall at a region that is not covered by the stand when the stand is in the closed state.

8. The electronic device according to claim 1, wherein the bottom end part of the stand is curved so as to extend further to the front surface side of the housing, when the stand is in the closed state.

9. The electronic device according to claim 1, wherein the bottom end part of the stand is configured so as to cover an upper portion of the recessed part in all regions of the recessed part in a lateral width direction of the housing, when the stand is in the closed state.

10. The electronic device according to claim 1, wherein
the recessed part extends in a lateral width direction of the housing, and
a bottom edge of the stand extends straight in the lateral width direction of the housing, proximal to the bottom end part of the stand which covers the recessed part when the stand is in the closed state.

11. The electronic device according to claim 1, wherein
the intermediate wall has a recess defining wall, which defines the recessed part, the recess defining wall has a plurality of ribs extending in a top-bottom direction and/or a front-back direction and spaced from one another along a lateral width direction of the housing, and the ventilation hole is formed between adjacent ones of a first group of the plurality of ribs, and spaces between adjacent ones of a remainder of the plurality of ribs are closed.

12. The electronic device according to claim 11, wherein the ventilation hole is formed between the adjacent ones of the first group of the plurality of ribs that are positioned centrally on the housing in the lateral width direction of the housing, the spaces between the adjacent ones of the remainder of the plurality of ribs that are closed are positioned outward in the lateral width direction of the housing, and a speaker hole is formed at a portion of a front wall of the housing positioned opposite the spaces between the adjacent ones of the remainder of the plurality of ribs that are closed.

13. The electronic device according to claim 1, wherein the recessed part has a length in a lateral width direction of the housing that is greater than or equal to half of a lateral width of the housing.

14. The electronic device according to claim 1, wherein the stand has a length in a lateral width direction of the housing that is greater than or equal to half of a lateral width of the housing.

15. The electronic device according to claim 1, wherein
the housing has a guide recessed part configured to be guided by a projecting part of a device holding apparatus for holding the electronic device, when the electronic device is inserted with its bottom surface facing down into the device holding apparatus,
the guide recessed part is positioned on the back wall and the intermediate wall, is depressed down from a back surface of the housing toward the front surface side, and extends more upward than the recessed part, and
the stand has a cutaway part, the guide recessed part being exposed through the cutaway part, when the stand is in the closed state.

16. The electronic device according to claim 15, wherein a length of the cutaway part in a lateral width direction of the housing is longer than a length of the guide recessed part in the lateral width direction of the housing.

17. The electronic device according to claim 15, wherein the recessed part is positioned on both sides of the guide recessed part in a lateral width direction of the housing.

18. A device holding system having the electronic device according to claim 15 and a device holding apparatus holding the electronic device, wherein, the device holding apparatus has a projecting part that guides the guide recessed part of the electronic device as the electronic device is inserted with a bottom surface facing downward into the device holding apparatus.

* * * * *